(12) United States Patent
Shibata et al.

(10) Patent No.: US 12,028,629 B2
(45) Date of Patent: Jul. 2, 2024

(54) SOLID-STATE IMAGING DEVICE AND ELECTRONIC DEVICE

(71) Applicant: Sony Semiconductor Solutions Corporation, Kanagawa (JP)

(72) Inventors: Tomohiko Shibata, Kanagawa (JP); Kiyoshige Tsuji, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 131 days.

(21) Appl. No.: 17/769,580

(22) PCT Filed: Nov. 13, 2020

(86) PCT No.: PCT/JP2020/042499
§ 371 (c)(1),
(2) Date: Apr. 15, 2022

(87) PCT Pub. No.: WO2021/111848
PCT Pub. Date: Jun. 10, 2021

(65) Prior Publication Data
US 2023/0300479 A1    Sep. 21, 2023

(30) Foreign Application Priority Data
Dec. 2, 2019 (JP) .................... 2019-218405

(51) Int. Cl.
*H04N 25/621* (2023.01)
*H01L 27/146* (2006.01)
(Continued)

(52) U.S. Cl.
CPC ......... *H04N 25/621* (2023.01); *H04N 25/709* (2023.01); *H04N 25/771* (2023.01);
(Continued)

(58) Field of Classification Search
CPC ......... H01L 27/14605; H01L 27/14634; H01L 27/14636; H01L 27/14645;
(Continued)

(56) References Cited

U.S. PATENT DOCUMENTS

| 4,271,420 A | 6/1981 | Chikamura |
| 9,332,200 B1 * | 5/2016 | Hseih .................. H04N 25/587 |

(Continued)

FOREIGN PATENT DOCUMENTS

| EP | 3425900 A1 | 1/2019 |
| JP | H10-248035 A | 9/1998 |

(Continued)

OTHER PUBLICATIONS

International Search Report (PCT/ISA/210), International Application No. PCT/JP2020/042499, dated Jan. 19, 2021.

*Primary Examiner* — Amy R Hsu
(74) *Attorney, Agent, or Firm* — Michael Best & Friedrich LLP

(57) ABSTRACT

An image sensor (102) includes a photoelectric conversion unit (10) that generates a photoelectric charge, a sense node (SN) (21) that is connected to the photoelectric conversion unit (10) and holds the photoelectric charge generated by the photoelectric conversion unit (10), a discharge transistor (15) for discharging the photoelectric charge held by the sense node (SN) (21) to the outside, and a voltage control unit (114) that controls a voltage value of an off voltage to be applied to a gate of the discharge transistor (15) when the discharge transistor (15) is turned off.

14 Claims, 17 Drawing Sheets

(51) Int. Cl.
*H04N 25/709* (2023.01)
*H04N 25/771* (2023.01)
*H04N 25/78* (2023.01)

(52) U.S. Cl.
CPC ....... *H04N 25/78* (2023.01); *H01L 27/14634* (2013.01); *H01L 27/14636* (2013.01); *H01L 27/14645* (2013.01)

(58) Field of Classification Search
CPC ............ H01L 27/14665; H04N 25/621; H04N 25/622; H04N 25/709; H04N 25/77; H04N 25/771; H04N 25/78; H04N 5/33
See application file for complete search history.

(56) References Cited

U.S. PATENT DOCUMENTS

| | | | |
|---|---|---|---|
| 2008/0036888 A1* | 2/2008 | Sugawa | H04N 25/778 348/294 |
| 2008/0079044 A1* | 4/2008 | Wada | H04N 25/771 257/292 |
| 2014/0307142 A1* | 10/2014 | Matsumoto | H04N 25/63 348/308 |
| 2016/0351606 A1* | 12/2016 | Azami | H01L 27/14656 |
| 2020/0018653 A1* | 1/2020 | Matsumiya | G01J 5/22 |
| 2020/0346004 A1* | 11/2020 | Cappy | A61N 1/36046 |
| 2021/0029322 A1* | 1/2021 | Mabuchi | H04N 25/616 |

FOREIGN PATENT DOCUMENTS

| | | |
|---|---|---|
| JP | H11-355664 A | 12/1999 |
| JP | 2001-197368 A | 7/2001 |
| JP | 2002-330346 A | 11/2002 |
| JP | 2004-111590 A | 4/2004 |
| JP | 2010-192659 A | 9/2010 |
| JP | 2015-153962 A | 8/2015 |
| JP | 2019041226 A | 3/2019 |
| JP | 2019-145875 A | 8/2019 |
| WO | 2017/169216 A1 | 10/2017 |

* cited by examiner

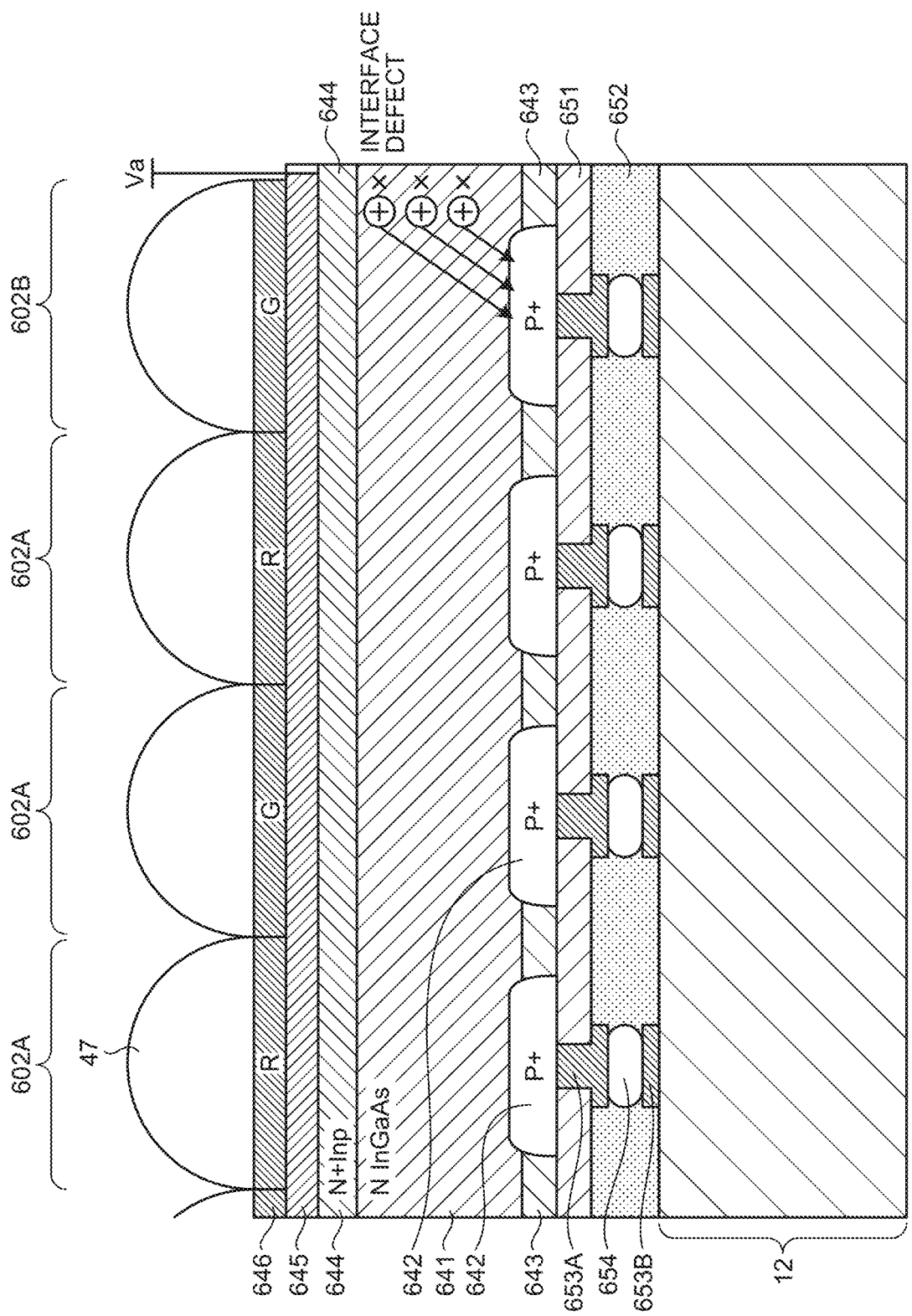

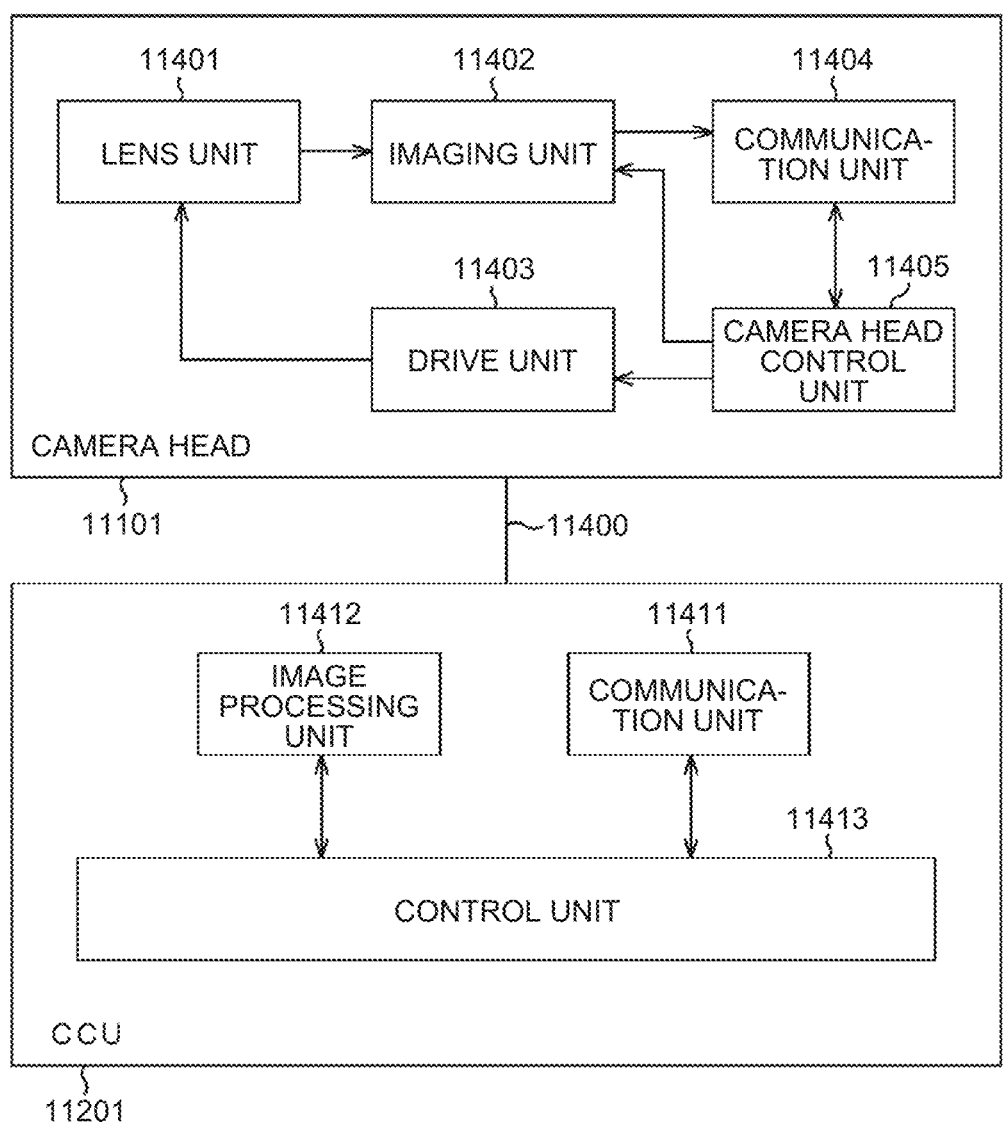

SOLID-STATE IMAGING DEVICE AND ELECTRONIC DEVICE

FIELD

The present disclosure relates to a solid-state imaging device and an electronic device.

BACKGROUND

In recent years, solid-state imaging elements such as complementary metal oxide semiconductor (CMOS) image sensors (CMOS image sensors (CISs)) have become widespread and are used by replacing with film-type photographing devices in various fields. A solid-state imaging element is not only used in place of a film-type photographing device in normal visible light photographing, but also prominently used in invisible light photographing such as ultraviolet rays, infrared rays, X-rays, and gamma rays photographing.

Further, among imaging devices having a photoelectric conversion film in a solid-state imaging element, there is an imaging device that handles holes as carriers of photoelectric conversion. Examples of the photoelectric conversion film using holes as carriers for photoelectric conversion include quantum (Q) dots, iridium gallium arsenide (InGaAs) sensors, organic compounds, and the like. In particular, a solid-state imaging element in which InGaAs is used as a photoelectric conversion film has a low dark current, has a narrower energy band gap than silicon, and can capture long-wavelength light such as infrared light, and therefore, is expected to be applied to a high-sensitivity infrared camera or the like.

CITATION LIST

Patent Literature

Patent Literature 1: JP 2001-197368 A
Patent Literature 2: JP H11-355664 A
Patent Literature 3: JP 2019-041226 A
Patent Literature 4: JP 2002-330346 A

SUMMARY

Technical Problem

However, in a case where holes are used as carriers for photoelectric conversion, it is difficult to appropriately form an overflow path, which is a path for releasing saturated holes to a constant voltage source, in a pixel circuit. In such a case, there is a problem that charges after saturation flow into adjacent pixels via the photoelectric conversion film, and blooming occurs.

Therefore, the present disclosure provides a solid-state imaging device and an electronic device that improve characteristics of a CMOS image sensor.

Solution to Problem

According to the present disclosure, a solid-state imaging device includes: a photoelectric conversion unit that generates a photoelectric charge; a first charge holding unit that is connected to the photoelectric conversion unit and holds the photoelectric charge generated by the photoelectric conversion unit; a first transistor for discharging the photoelectric charge held by the first charge holding unit to an outside; and a voltage control unit that controls a voltage value of an off voltage to be applied to a gate of the first transistor when the first transistor is turned off.

BRIEF DESCRIPTION OF DRAWINGS

FIG. 12 is a diagram illustrating a cross-sectional configuration of another light receiving element.
FIG. 16 is a block diagram illustrating an example of functional configurations of a camera head and a CCU.

DESCRIPTION OF EMBODIMENTS

Figure 1:
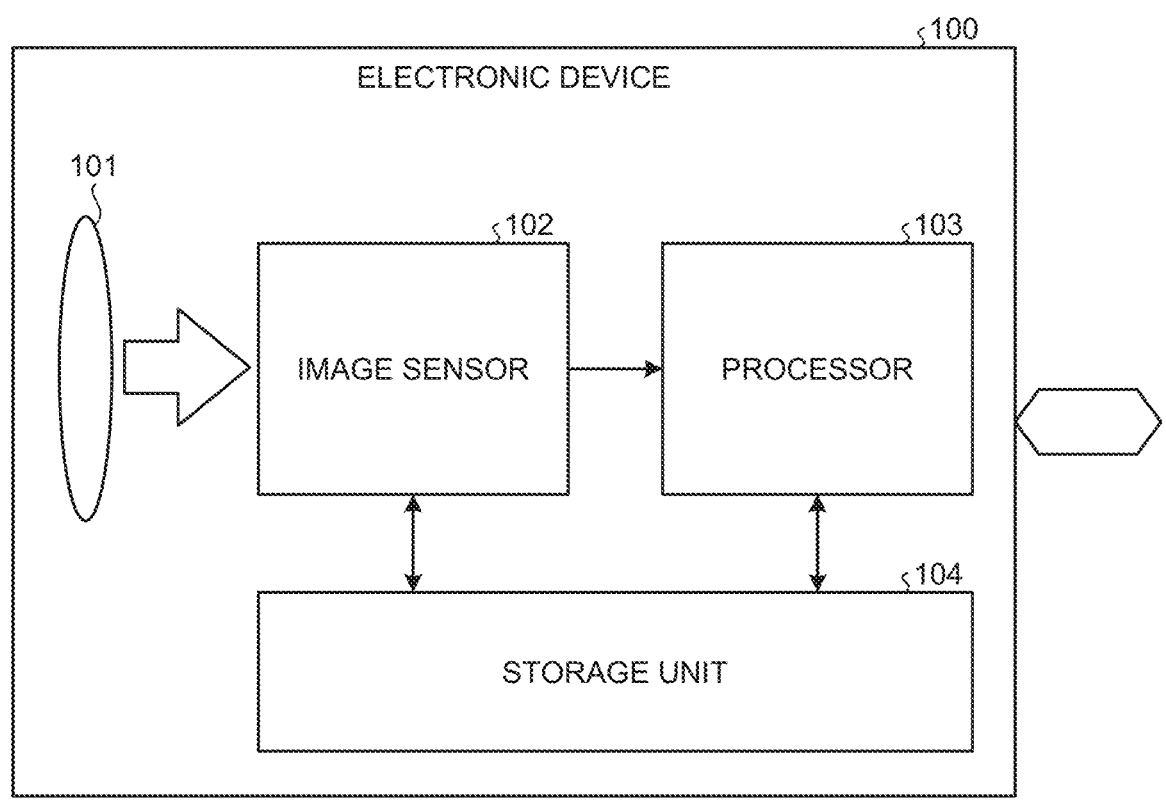
FIG. 1 is a block diagram illustrating a schematic configuration example of an electronic device according to a first embodiment.

Hereinafter, embodiments of the present disclosure will be described in detail with reference to the drawings. In each of the following embodiments, the same portions are denoted by the same reference signs, and repetitive description will be omitted.

1. First Embodiment
2. Second Embodiment
3. Third Embodiment
4. Fourth Embodiment
5. Fifth Embodiment
6. Application Example
7. Application Example to Mobile Body
8. Application Example to Endoscopic Surgical System

1. First Embodiment

A conventional CMOS image sensor performs electronic readout, and measures against blooming are taken by forming an overflow path for discharging electrons accumulated in a photodiode (PD) to a power source. Some conventional CMOS image sensors have a discharge (OFG: overflow gate) transistor that discharges charges to a constant voltage source. On the other hand, a photoelectric conversion film formed using an InGaAs sensor uses holes as carriers for photoelectric conversion. Holes and electrons generated from the photoelectric conversion film are recombined, and a reduced amount of electrons is treated as a signal. Therefore, in a readout circuit using an N-type MOS transistor (NMOS), it is difficult to store holes, and it is difficult to form an overflow path for holes. Therefore, the voltage of a sense node (SN), which is a diffusion layer connected to the photoelectric conversion film in which the InGaAs sensor is used, increases to the voltage of an upper electrode Vtop.

A reverse bias voltage applied to the photoelectric conversion film decreases as holes recombine with electrons and the voltage of SN increases. The reverse bias voltage is a voltage obtained by subtracting the voltage of SN from a bias voltage. When the bias voltage becomes substantially zero, the electric field between the PN junctions of the photoelectric conversion film decreases, and the current due to the holes flowing from the photoelectric conversion film to the readout circuit decreases. As the current due to the holes flowing to the readout circuit decreases, the current due to the holes diffusing into the N region increases, and the diffused holes are drawn by the electric field between the PN junctions of the adjacent pixels and flow into the adjacent pixels, and blooming occurs.

Therefore, as one of measures against blooming, there is a method of forming an overflow path to suppress an increase in the voltage of SN. Therefore, it is conceivable to use a P-type transistor (PMOS) as a MOS transistor that receives holes output from the photoelectric conversion film. By disposing the PMOS, holes can be accumulated in the SN, and an overflow path can be formed in the readout circuit. The image sensor can be driven while the reverse bias is kept constant by the overflow path for holes in the readout circuit, and it can be expected that blooming in the photoelectric conversion film is suppressed.

However, the setting of the barrier for the holes formed in the PMOS has a trade-off relationship between the suppression amount of the occurrence of blooming and the saturation signal amount. That is, when the barrier is increased, the saturation signal amount increases, but the possibility of occurrence of blooming increases. On the other hand, when the barrier is lowered, the amount of suppression of the occurrence of blooming increases, but the saturation signal amount decreases. In a pixel array, it is important to suppress blooming in a pixel in an effective pixel region adjacent to an optical black (OPB) pixel, but it is important to improve image quality by securing a saturation signal amount in a pixel inside the effective pixel region.

However, in the conventional pixel, since the setting of the barrier in the MOS transistor is fixed, either blooming priority or saturation signal amount priority is selected in advance, and it is difficult to meet the demand for each pixel. Therefore, the imaging element according to the present embodiment adjusts the ease of overflow path formation, that is, the height of the barrier by changing the gate voltage of the discharge transistor, and suppresses the occurrence of blooming and secures the saturation charge amount Qs in accordance with each pixel.

[Configuration of Electronic Device]

FIG. 1 is a block diagram illustrating a schematic configuration example of an electronic device according to a first embodiment. As illustrated in FIG. 1, an electronic device 100 includes, for example, an imaging lens 101, an image sensor 102, a processor 103, and a storage unit 104.

The imaging lens 101 is an example of an optical system that condenses incident light and forms an image thereof on a light receiving surface of the image sensor 102. The light receiving surface may be a surface on which photoelectric conversion elements in the image sensor 102 are arranged. The image sensor 102 photoelectrically converts the incident light to generate image data. The image sensor 102 executes predetermined signal processing such as noise removal and white balance adjustment on the generated image data.

The storage unit 104 includes, for example, a flash memory, a dynamic random access memory (DRAM), a static random access memory (SRAM), or the like, and records image data or the like input from the image sensor 102.

The processor 103 is configured using, for example, a central processing unit (CPU) or the like, and may include an application processor that executes an operating system, various types of application software, or the like, a graphics processing unit (GPU), a baseband processor, or the like. The processor 103 executes various processes as necessary on the image data input from the image sensor 102, the image data read out from the storage unit 104, and the like, executes display to a user, and transmits the image data to the outside via a predetermined network.

[Configuration of Image Sensor]

Figure 2:
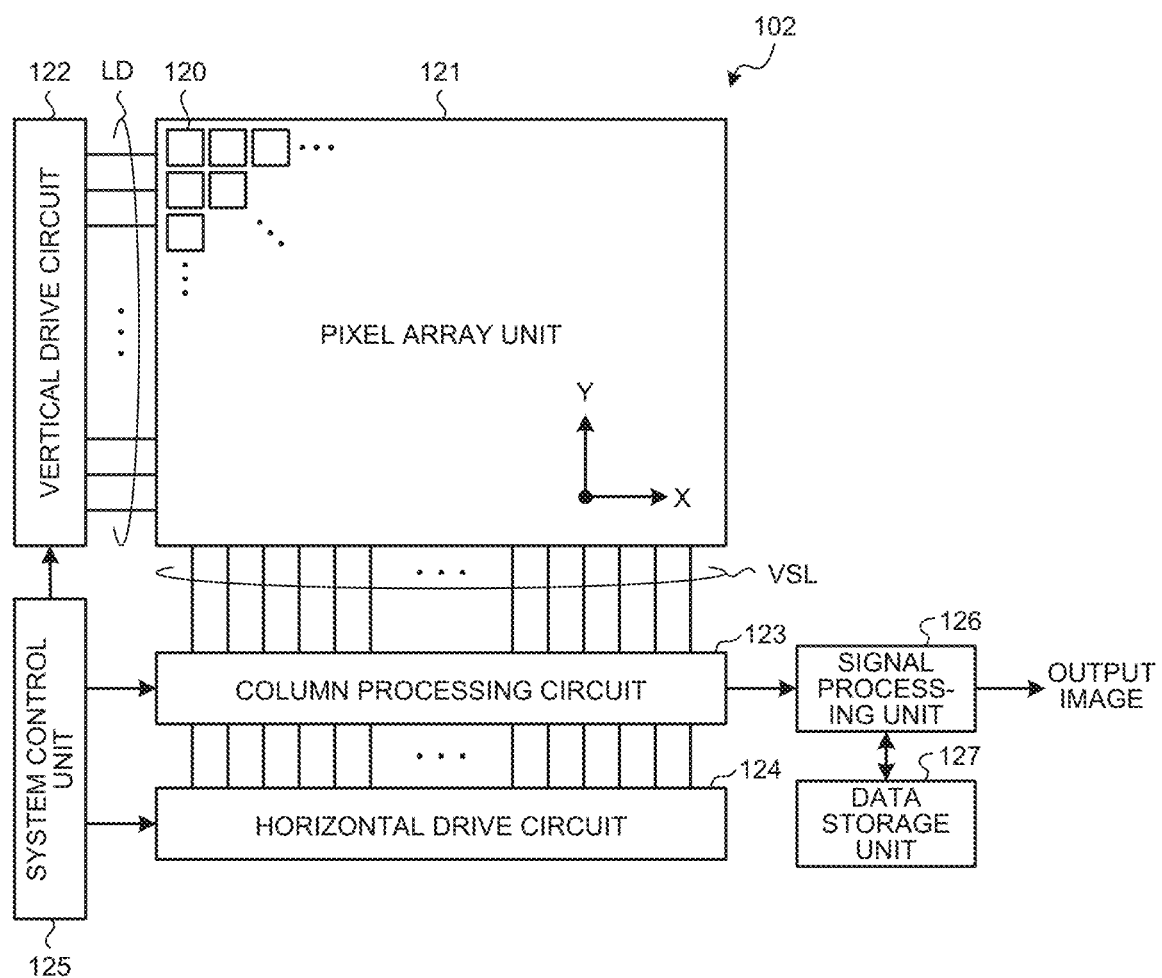
FIG. 2 is a block diagram illustrating a schematic configuration example of an image sensor according to the first embodiment.

FIG. 2 is a block diagram illustrating a schematic configuration example of the image sensor according to the first embodiment. The image sensor 102 is a CMOS image sensor. Here, the CMOS image sensor is an image sensor created by applying or partially using a CMOS process. For example, the image sensor 102 is a back-illuminated image sensor. The image sensor 102 corresponds to an example of a "solid-state imaging device".

The image sensor 102 according to the present embodiment has, for example, a stack structure in which a semiconductor chip on which a pixel array 121 is formed and a semiconductor chip on which a peripheral circuit is formed are stacked. The peripheral circuit includes, for example, a vertical drive circuit 122, a column processing circuit 123, a horizontal drive circuit 124, and a system control unit 125.

The image sensor 102 further includes a signal processing unit 126 and a data storage unit 127. The signal processing unit 126 and the data storage unit 127 may be provided on the same semiconductor chip as the peripheral circuit, or may be provided on another semiconductor chip.

The pixel array 121 has a configuration in which unit pixels (hereinafter, it may be simply described as "pixel") 120 each having a photoelectric conversion element that generates and accumulates charges according to the amount of received light are arranged in a row direction and a column direction, that is, in a two-dimensional lattice shape in a matrix. Here, the row direction refers to an array direction of pixels in a pixel row (lateral direction in drawings), and the column direction refers to an array direction of pixels in a pixel column (longitudinal direction in drawings). A specific circuit configuration and pixel structure of the pixel 120 will be described later in detail.

In the pixel array 121, pixel drive lines LD are wired along the row direction for each pixel row, and vertical signal lines VSL are wired along the column direction for each pixel column with respect to the pixel array in a matrix. The pixel drive lines LD transmit a drive signal for driving when a signal is read out from a pixel. In FIG. 2, the pixel drive lines LD are illustrated as wirings one by one but are not limited to wirings one by one. One end of the pixel drive line LD is connected to an output end corresponding to each row of the vertical drive circuit 122.

The vertical drive circuit 122 includes a shift register, an address decoder, and the like, and drives the respective pixels 120 of the pixel array 121 at the same time for all the pixels or in units of rows. That is, the vertical drive circuit 122 constitutes a drive unit that controls the operation of each pixel 120 of the pixel array 121 together with the system control unit 125 that controls the vertical drive circuit 122. Although a specific configuration of the vertical drive circuit 122 is not illustrated, the vertical drive circuit 122 generally includes two scanning systems of a readout scanning system and a sweep scanning system.

The readout scanning system sequentially selects and scans the pixel 120 of the pixel array 121 in units of rows in order to read out a signal from the pixel 120. The signal read out from the pixel 120 is an analog signal. The sweep scanning system performs sweep scanning on a readout row on which readout scanning is performed by the readout scanning system prior to the readout scanning by the time of exposure.

By the sweep scanning by the sweep scanning system, unnecessary charges are swept out from the photoelectric conversion elements of the pixels 120 in the readout row, whereby the photoelectric conversion elements are reset. Then, by sweeping out (resetting) unnecessary charges in the sweep scanning system, a so-called electronic shutter operation is performed. Here, the electronic shutter operation refers to an operation of discarding charges of the photoelectric conversion element and newly starting exposure (starting accumulation of charges).

The signal read out by the readout operation by the readout scanning system corresponds to the amount of light received after the immediately preceding readout operation or electronic shutter operation. Then, a period from the readout timing by the immediately preceding readout operation or the sweep timing by the electronic shutter operation to the readout timing by the current readout operation is a charge accumulation period (also referred to as an exposure period) in the pixel 120.

A signal output from each pixel 120 of the pixel row selectively scanned by the vertical drive circuit 122 is input to the column processing circuit 123 through each of the vertical signal lines VSL for each pixel column. The column processing circuit 123 performs predetermined signal processing on a signal output from each pixel 120 of the selected row through the vertical signal line VSL for each pixel column of the pixel array 121, and temporarily holds a pixel signal after the signal processing.

Specifically, the column processing circuit 123 performs at least noise removal processing, for example, correlated double sampling (CDS) processing or double data sampling (DDS) processing, as the signal processing. For example, by the CDS processing, reset noise and fixed pattern noise unique to the pixel such as threshold variation of the amplification transistor in the pixel 120 are removed. The column processing circuit 123 also has, for example, an analog-digital (AD) conversion function, converts an analog pixel signal read out from the photoelectric conversion element into a digital signal, and outputs the digital signal.

The horizontal drive circuit 124 includes a shift register, an address decoder, and the like, and sequentially selects readout circuits (hereinafter, referred to as a pixel circuit) corresponding to pixel columns of the column processing circuit 123. By the selective scanning by the horizontal drive circuit 124, pixel signals subjected to signal processing for each pixel circuit in the column processing circuit 123 are sequentially output.

The system control unit 125 includes a timing generator that generates various timing signals and the like, and performs drive control of the vertical drive circuit 122, the column processing circuit 123, the horizontal drive circuit 124, and the like on the basis of various timings generated by the timing generator.

The signal processing unit 126 has at least an arithmetic processing function and performs various types of signal processing such as arithmetic processing on the pixel signal output from the column processing circuit 123. The data storage unit 127 temporarily stores data necessary for signal processing in the signal processing unit 126.

Note that the image data output from the signal processing unit 126 may be subjected to predetermined processing in the processor 103 or the like in the electronic device 100 equipped with the image sensor 102, or may be transmitted to the outside via a predetermined network, for example.

[Configuration of Pixel Circuit According to First Embodiment]

Figure 3:
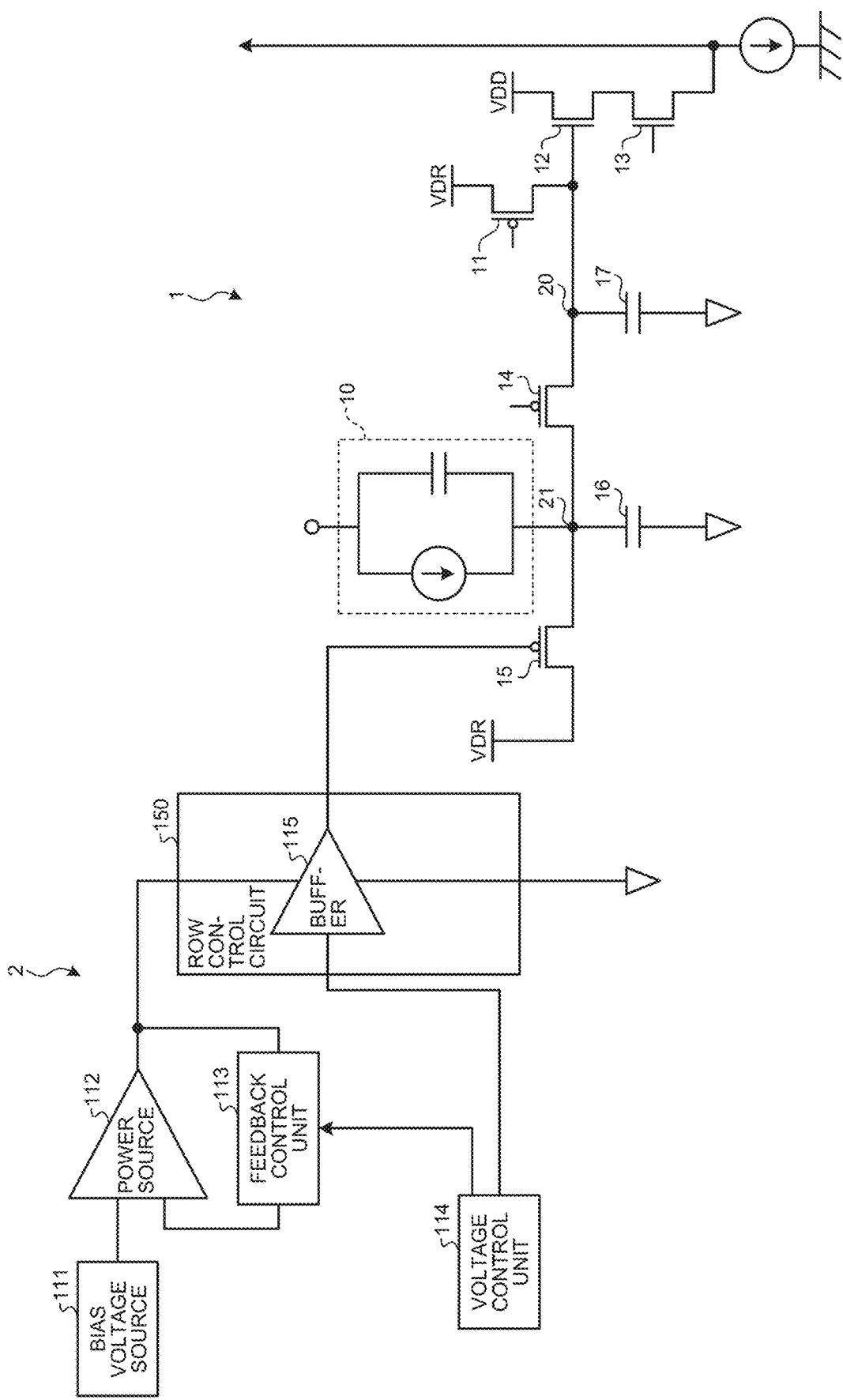
FIG. 3 is a circuit diagram of a pixel circuit according to the first embodiment.

FIG. 3 is a circuit diagram of a pixel circuit and a voltage control circuit according to the first embodiment. The pixel 120 includes a pixel circuit 1 and a voltage control circuit 2 illustrated in FIG. 3. The pixel 120 including the pixel circuit 1 corresponds to an example of a "solid-state imaging device".

The pixel circuit 1 includes a photoelectric conversion film (also referred to as a photoelectric conversion unit) 10, a reset (RST: reset) transistor 11, an amplification (AMP: amplifier) transistor 12, and a selection (SEL: select) transistor 13. The pixel circuit 1 includes a transfer (TRG: transfer gate) transistor 14 and a discharge (OFG: overflow gate) transistor 15. In addition, the pixel circuit 1 includes a sense node (SN) 21 which is a diffusion layer of a source of the transfer transistor 14 and a drain of the discharge transistor 15 and a floating diffusion (FD) 20 which is a floating diffusion layer. Further, the pixel circuit 1 according to the present embodiment includes capacitors 16 and 17. The pixel circuit 1 according to the present embodiment is an FD holding type global shutter (GS) pixel circuit.

The photoelectric conversion film 10 according to the present embodiment is a photoelectric conversion film using an InGaAs sensor and using holes formed as carriers of photoelectric conversion. The photoelectric conversion film 10 may also be formed using, for example, indium arsenide antimony (InAsSb), indium arsenide (InAs), indium antimony (InSb), mercury cadmium telluride (HgCdTe), germanium (Ge), a quantum (Q) dot, an organic compound, or the like. The photoelectric conversion film 10 corresponds to an example of a "photoelectric conversion unit".

An output terminal of the photoelectric conversion film 10 according to the present embodiment is connected to the SN 21 connected to the source of the discharge transistor 15, the source of the transfer transistor 14, and the capacitor 16. The discharge transistor 15 has a source connected to the SN 21 and a drain connected to a low voltage source VDR. The transfer transistor 14 has a source connected to the SN 21 and a drain connected to the FD 20. An output terminal of the FD 20 is connected to the source of the reset transistor 11, the gate of the amplification transistor 12, and the capacitor 17. The drain of the reset transistor 11 is connected to the low voltage source VDR. The drain of the amplification transistor 12 is connected to a voltage source VDD. The source of the amplification transistor 12 is connected to the drain of the selection transistor 13. The source of the selection transistor 13 is connected to the output signal line. The capacitor 16 is connected to an output terminal of the photoelectric conversion film 10. The capacitor 17 is connected to the FD 20.

As described above, the output terminal of the photoelectric conversion film 10 is connected to the SN 21. The photoelectric conversion film 10 outputs holes, which are photoelectric conversion carriers, from the output terminal.

As described above, the SN 21 is connected to the output terminal of the photoelectric conversion film 10, the source of the discharge transistor 15, and the source of the transfer transistor 14. Further, the SN 21 includes a capacitor 16 that is a high-capacitance element.

One terminal of the capacitor 16 is connected to the SN 21 as described above, and the other terminal is connected to a counter electrode. As the counter electrode voltage, any voltage such as a constant voltage source (VDD) or a ground potential (GND) can be used. The capacitor 16 accumulates and holds the charges output from the photoelectric conversion film 10.

The charges held by the SN 21 including the capacitor 16 are discharged to the low voltage source VDR when the discharge transistor 15 is turned on. On the other hand, when the transfer transistor 14 is turned on, the charges held by the SN 21 including the capacitor 16 are transferred to the FD 20.

The discharge transistor 15 is a PMOS. As described above, the discharge transistor 15 has a source connected to the SN 21 and a drain connected to the low voltage source VDR. Further, the gate of the discharge transistor 15 is connected to a discharge control signal line.

The discharge transistor 15 which is a PMOS is turned on when a voltage equal to or lower than a threshold voltage is applied to the gate. The discharge transistor 15 is turned off when a voltage higher than the threshold voltage is applied to the gate. That is, in the discharge transistor 15, a barrier is set when a voltage larger than the threshold voltage, which is an off voltage, is applied to the gate. When the discharge transistor 15 is turned on, the discharge transistor 15 causes the charges held in the photoelectric conversion film 10 and the capacitor 16 to be discharged to the low voltage source VDR, and resets the photoelectric conversion film 10.

Further, as the gate voltage applied to the gate of the discharge transistor 15, two types of voltages are used according to the maximum value of the required saturation charge amount. One is a gate voltage in a case where securing of the saturation charge amount is prioritized by maximizing the saturation charge amount and increasing the barrier. The gate voltage in this case is referred to as "saturation charge amount priority gate voltage". The other is a gate voltage in a case where suppression of occurrence of blooming is prioritized by reducing the saturation charge amount and lowering the barrier. The gate voltage in this case is referred to as "blooming priority gate voltage". Since the discharge transistor 15 is a PMOS in which holes accumulate, the lower the potential of the barrier, the higher the barrier against holes, and the higher the potential of the barrier, the lower the barrier against holes. Therefore, the saturation charge amount priority gate voltage is higher than the blooming priority gate voltage. For example, in the case of the saturation charge amount priority gate voltage, the output voltage when the saturation charge amount is maximum is 360 mV. In the case of the blooming priority gate voltage, the output voltage when the saturation charge amount is maximum is 180 mV.

When the gate voltage is the saturation charge amount priority gate voltage, in the discharge transistor 15, the barrier becomes high, and it becomes difficult to form an overflow path connecting the SN 21 and the low voltage source VDR, and therefore the saturation charge amount increases. On the other hand, when the gate voltage is the blooming priority gate voltage, in the discharge transistor 15, the barrier becomes low, and it becomes easy to form an overflow path connecting the SN 21 and the low voltage source VDR, and therefore the saturation charge amount decreases.

In each pixel 120, the gate voltage of the discharge transistor 15 is determined according to the position of the pixel 120 in the pixel array 121. For example, in the case of the pixel 120 adjacent to an OPB pixel, the gate voltage of the discharge transistor 15 is the blooming priority gate voltage. On the other hand, in the case of the pixel 120 located inside the pixel array 121, the gate voltage of the discharge transistor 15 is the saturation charge amount priority gate voltage.

The transfer transistor 14 is also a PMOS. As described above, the transfer transistor 14 has a source connected to the output terminal of the photoelectric conversion film 10 and a drain connected to the FD 20. Further, a gate of the transfer transistor 14 is connected to a transfer signal line. The transfer transistor 14 which is a PMOS is turned on when a voltage equal to or lower than a threshold voltage is applied to the gate by a signal transmitted from the transfer signal line. The transfer transistor 14 is turned off when a voltage higher than the threshold voltage is applied to the gate. When turned on, the transfer transistor 14 transfers the charges generated by the photoelectric conversion film 10 and accumulated in the capacitor 16 to the FD 20.

As described above, the FD 20 is connected to the drain of the transfer transistor 14, the source of the reset transistor 11, and the gate of the amplification transistor 12. Further, the FD 20 includes a capacitor 17 that is a high-capacitance element.

One terminal of the capacitor 17 is connected to the FD 20 as described above, and the other terminal is connected to a counter electrode. As the counter electrode voltage, any voltage such as a constant voltage source (VDD) or a ground potential (GND) can be used. The capacitor 17 accumulates and holds the charges transferred from the SN 21.

When the transfer transistor 14 is turned on, the charges held in the SN 21 including the capacitor 17 are transferred to the FD 20 including the capacitor 17, and the transferred charges are accumulated and held. The FD 20 applies a voltage generated by the charges held in the capacitor 17 or the like to the gate of the amplification transistor 12. The FD 20 turns on the amplification transistor 12 by applying a voltage equal to or higher than a threshold voltage to the gate of the amplification transistor 12. When the reset transistor 11 is turned on, the charges held by the FD 20 including the capacitor 17 are discharged to the low power source VDR, and the FD 20 is reset.

Here, in the present embodiment, the capacitors 16 and 17 for securing the capacitance in the SN 21 and the FD 20 are provided in the pixel circuit 1, but the capacitors 16 and 17 do not have to be provided.

The reset transistor 11 is a PMOS. As described above, the reset transistor 11 has a source connected to the path connected to the FD 20 and a drain connected to the low voltage source VDR. Further, the gate of the reset transistor 11 is connected to a reset signal line. The reset transistor 11 is turned on when a voltage equal to or lower than the threshold voltage is applied to the gate. The reset transistor 11 is turned off when a voltage higher than the threshold voltage is applied to the gate. When the reset transistor 11 is turned on, the reset transistor 11 causes the charges accumulated in the FD 20 to be discharged to the low voltage source VDR and resets the FD 20 including the capacitor 17.

The amplification transistor 12 is an NMOS. As described above, the amplification transistor 12 has a gate connected to the path connected to the FD 20, a source connected to the voltage source VDD, and a drain connected to the source of the selection transistor 13. The amplification transistor 12 is turned on when a voltage equal to or higher than a threshold voltage is applied to the gate by the charges output from the FD 20. The amplification transistor 12 is turned off when a voltage smaller than the threshold voltage is applied to the gate. When turned on, the amplification transistor 12 outputs the current input from the voltage source VDD to the selection transistor 13. That is, the amplification transistor 12 outputs a signal based on the charges held in the FD 20 to the selection transistor 13.

The selection transistor 13 is an NMOS. As described above, the selection transistor 13 has a source connected to the drain of the amplification transistor 12 and a drain connected to the output signal line. A gate of the selection transistor 13 is connected to a selection signal line. Since the selection transistor 13 is an NMOS, the selection transistor is turned on when a voltage equal to or higher than the threshold voltage is applied to the gate. The selection transistor 13 is turned off when a voltage lower than the threshold voltage is applied to the gate. When turned on, the selection transistor 13 outputs the signal output from the amplification transistor 12 to the output signal line as a pixel signal. That is, the selection transistor 13 determines whether or not to output a pixel signal from the pixel circuit 1, thereby controlling selection of a pixel at the time of readout.

Next, the voltage control circuit 2 will be described. The voltage control circuit 2 is a circuit that adjusts the gate voltage of the discharge transistor 15. The voltage control circuit 2 includes a bias voltage source 111, a power source 112, a feedback control unit 113, a voltage control unit 114, and a row control circuit 150. The row control circuit 150 includes a plurality of buffers 115 corresponding to each row of the pixel array 121. Here, in FIG. 3, the pixel circuit 1 is described for one buffer 115, but actually, the row control circuit 150 collectively controls the pixels 120 included in one row of the pixel array 121 by one buffer 115.

The bias voltage source 111 is a constant voltage source that outputs a bias voltage having a predetermined voltage. The bias voltage source 111 supplies a predetermined voltage to the power source 112.

The power source 112 is, for example, a linear regulator, a charge pump, a switching regulator, or the like. An input of the bias voltage is received from the bias voltage source 111. The power source 112 receives an input of a feedback signal from the feedback control unit 113. Then, the power source 112 adjusts the voltage according to the feedback signal and outputs the voltage. For example, when the feedback signal is a signal representing a difference from the reference voltage, the voltage is adjusted to reduce the difference.

The feedback control unit 113 receives an input of an output voltage of the power source 112. In addition, the feedback control unit 113 receives, from the voltage control unit 114, an input of information of a specified gate voltage of the saturation charge amount priority gate voltage or the blooming priority gate voltage. Then, the feedback control unit 113 compares the output voltage of the power source 112 with the specified gate voltage to generate a feedback signal. For example, the feedback control unit 113 calculates a difference between the output voltage of the power source 112 and the specified gate voltage to obtain a feedback signal. Then, the feedback control unit 113 outputs the generated feedback signal to the power source 112.

The voltage control unit 114 receives an input of setting information of the gate voltage indicating which one of the saturation charge amount priority gate voltage and the blooming priority gate voltage is used as the gate voltage for each row in the pixel array 121. Thereafter, the voltage control unit 114 holds the setting information of the gate voltage for each row in the register included therein. Then, the voltage control unit 114 outputs information of the gate voltage designated by the setting information to the feedback control unit 113 for each row. Here, the voltage control unit 114 may notify the feedback control unit 113 of the value of the gate voltage itself or may notify the feedback control unit 113 of information indicating the value of each gate voltage. The information indicating the value of the gate voltage is, for example, information set in advance such that "0" indicates the saturation charge amount priority gate voltage, "1" indicates the blooming priority gate voltage, and the like.

In addition, the voltage control unit 114 includes a timing generator. The voltage control unit 114 outputs an ON/OFF timing pulse of the discharge transistor 15 to the buffer 115.

The buffer 115 holds a voltage input from the power source 112. Then, the buffer 115 applies the holding voltage to the gate of the discharge transistor 15 in accordance with the timing pulse input from the voltage control unit 114.

[Operation of Pixel Circuit According to First Embodiment]

Here, a flow of pixel signal generation in the pixel circuit 1 of FIG. 3 will be described. First, the discharge transistor 15 is conducted to reset the photoelectric conversion film 10, the SN 21, and the capacitor 16. Thereafter, by turning off the discharge transistor 15, the charges generated in the photoelectric conversion film 10 are accumulated and held in the SN 21 and the capacitor 16. The operations from the reset of the photoelectric conversion film 10 to the holding of charges in the capacitor 16 are simultaneously performed in all the pixels 120 arranged in the pixel array 121. This realizes a global shutter. Note that the period from the reset of the photoelectric conversion film 10 to the holding of charges in the capacitor 16 corresponds to the exposure period.

Next, the reset transistor 11 is conducted to reset the capacitor 17 and the FD 20. Next, the reset transistor 11 is turned off, and the transfer transistor 14 is turned on. This causes the charges accumulated in the SN 21 and the capacitor 16 to be transferred to the FD 20 and to be accumulated and held in the capacitor 17 and the FD 20.

Then, when the potential of the FD 20 exceeds the potential of the barrier generated by the discharge transistor 15 in a state where the transfer transistor 14 is turned on and holes are accumulated in the FD 20, an overflow path via the discharge transistor 15 is formed. This increases the potential of the SN 21, whereby overflow between the FDs 20 due to saturation of the FD 20 is avoided.

Here, when the gate voltage of the discharge transistor 15 is the blooming priority gate voltage, the potential of the barrier generated by the discharge transistor 15 is set to be lower than that in the case of the saturation charge amount priority gate voltage, and the barrier becomes lower. Therefore, the overflow path via the discharge transistor 15 is easily formed as compared with the case of the saturation charge amount priority gate voltage. This can further suppress the occurrence of blooming as compared with the case of the saturation charge amount priority gate voltage. On the other hand, since the barrier generated by the discharge transistor 15 is low, the saturation charge amount is smaller than that in the case of the saturation charge amount priority gate voltage.

On the other hand, when the gate voltage of the discharge transistor 15 is the saturation charge amount priority gate voltage, the potential of the barrier generated by the discharge transistor 15 is set higher than that in the case of the blooming priority gate voltage, and the barrier becomes higher. Therefore, the saturation charge amount becomes larger than that in the case of the blooming priority gate voltage. On the other hand, since the barrier generated by the discharge transistor 15 is high, it is difficult to form the overflow path via the discharge transistor 15 as compared with the case of the saturation charge amount priority gate voltage. Therefore, the occurrence of blooming may increase as compared with the case of the blooming priority gate voltage.

In a case where the potential of the holes accumulated in the state where the transfer transistor 14 is off is higher than the potential of the barrier generated by the transfer transistor 14, an overflow path via the transfer transistor 14 is formed. Then, holes lower than the potential of the barrier generated by the transfer transistor 14 are discharged via the overflow path.

In a case where the potential of the holes accumulated in the state where the reset transistor 11 is turned off is higher than the potential of the barrier generated by the reset transistor 11, an overflow path via the reset transistor 11 is formed. Then, holes higher than the potential of the barrier generated by the reset transistor 11 are discharged via the overflow path.

The amplification transistor 12 generates a pixel signal according to the charges held in the FD 20. Next, by making the selection transistor 13 conductive, the pixel signal generated by the amplification transistor 12 is output to the output signal line. The operations from the reset of the FD 20 to the output of the pixel signal are sequentially performed for each pixel circuit 1 arranged in the pixel array 121. The pixel signal output processing is performed in all the pixel circuits 1 of the pixel array 121, whereby a frame that is a pixel signal for one screen is generated.

Figure 4:
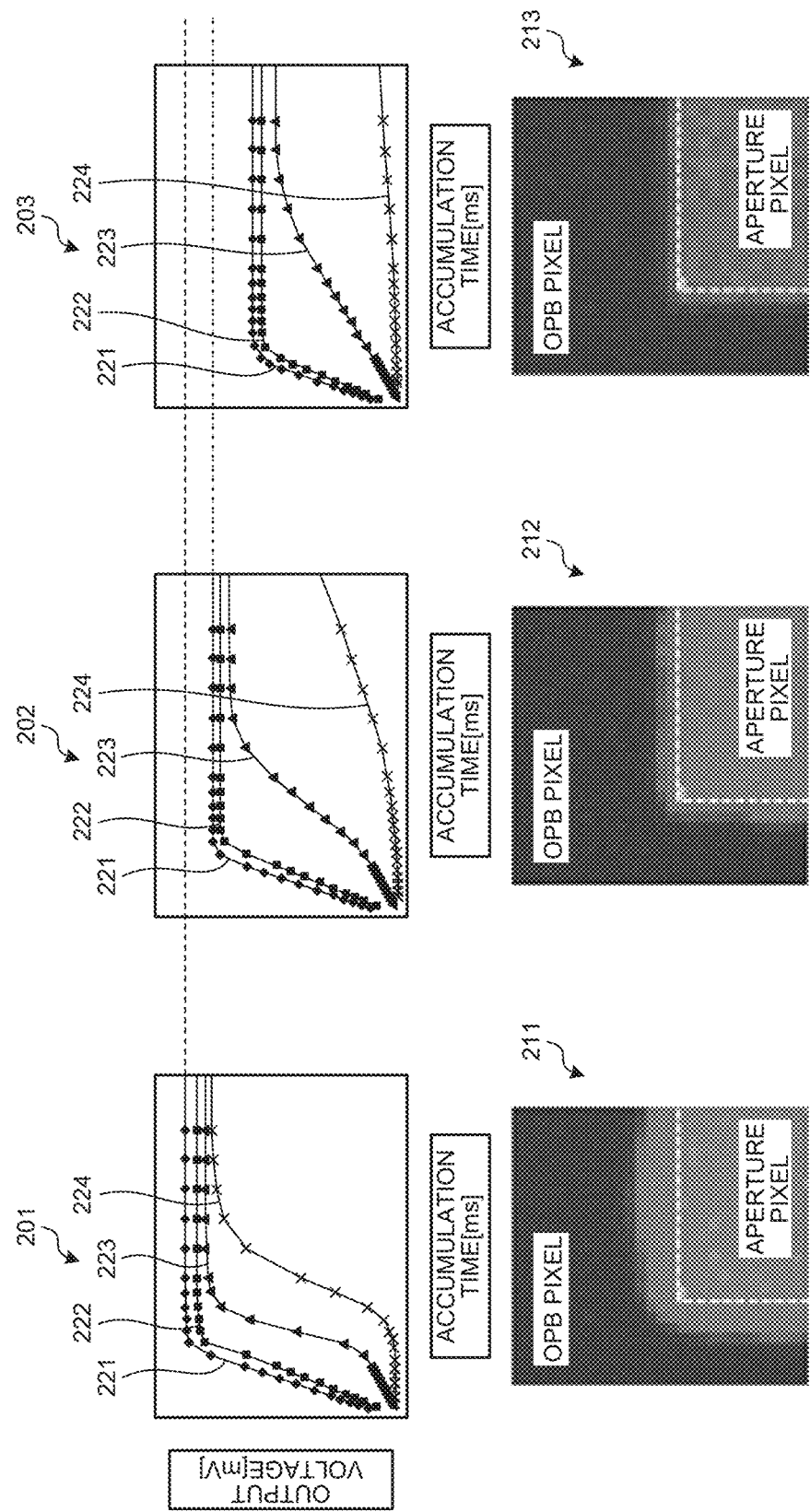
FIG. 4 is a diagram illustrating an example of an output voltage according to a gate voltage of a discharge transistor and a blooming state.

FIG. 4 is a diagram illustrating an example of an output voltage according to the gate voltage of the discharge transistor and a blooming state. A graph 201 is a graph illustrating the output voltage and the accumulation time in each pixel 120 when a High voltage of the gate voltage is set to the first voltage which is the highest among three states. A graph 202 is a graph illustrating the output voltage and the accumulation time in each pixel 120 when the High voltage of the gate voltage is set to the second voltage lower than that in the case of the graph 201. A graph 203 is a graph illustrating the output voltage and the accumulation time in each pixel 120 when the High voltage of the gate voltage is set to the third voltage lower than that in the case of the graph 202. In the graphs 201 to 203, the vertical axis represents the output voltage, and the horizontal axis represents the charge accumulation time. A curve 221 in the graphs 201 to 203 is the output voltage of the pixel 120 inside an aperture pixel in the effective pixel region. A curve 222 is the output voltage of the pixel 120 at an end portion of the aperture pixel in the effective pixel region. A curve 223 is the output voltage of the pixel 120 on the first row from the aperture pixel of the OPB pixel. A curve 223 is the output voltage of the pixel 120 on the second row from the aperture pixel of the OPB pixel.

An image 211 represents a blooming occurrence state in the case of the graph 201, an image 212 represents a blooming occurrence state in the case of the graph 202, and an image 213 represents a blooming occurrence state in the case of the graph 203. Portions indicated by broken lines in the images 211 to 213 correspond to the end portion of the aperture pixel.

When the gate voltage is the first voltage, as illustrated in the graph 201, the output voltage of each pixel 120 is higher than that in other cases. That is, it can be seen that when the gate voltage is the first voltage, the saturation charge amount is larger than that in other cases. However, as illustrated in the image 211, large blooming occurs in the region from the end portion of the aperture pixel to the OPB pixel. On the other hand, when the gate voltage is set to the second voltage V, as illustrated in the graph 202, the output voltage of each pixel 120 decreases as compared with the case where the gate voltage is the first voltage. However, as illustrated in the image 212, the occurrence of blooming decreases as compared with the case where the gate voltage is the first voltage. Further, in a case where the gate voltage is set to the third voltage, as illustrated in the graph 203, the output voltage of each pixel 120 further decreases as compared with the case where the gate voltage is the second voltage. However, as illustrated in the image 213, the occurrence of blooming further decreases as compared with the case where the gate voltage is the second voltage, and it can be said that blooming is substantially suppressed.

In this manner, by lowering the gate voltage of the discharge transistor 15, the saturation charge amount decreases, and the image quality is lowered accordingly, but occurrence of blooming can be suppressed. Therefore, it is preferable to increase the gate voltage inside the aperture pixel and to decrease the gate voltage at the end portion of the aperture pixel.

Operation and Effect

As described above, the pixel circuit 1 according to the present embodiment is an FD holding type and includes the photoelectric conversion film 10 in which holes are used as photoelectric conversion carriers. Then, in the pixel circuit 1 according to the present embodiment, the PMOS is used as the discharge transistor 15, and either the saturation charge amount priority gate voltage or the blooming priority gate voltage is used as the gate voltage of the discharge transistor 15.

As a result, the pixel circuit 1 according to the present embodiment can store holes in the discharge transistor 15 and can discharge the holes by forming an overflow path before the holes flow out to the adjacent pixel 120. Further, by switching the gate voltage of the discharge transistor 15, it is possible to adjust ease of forming an overflow path and the saturation charge amount. That is, it is possible to suppress the occurrence of blooming and increase the saturation charge amount. Therefore, the suppression of blooming and the saturation charge amount can be adjusted according to the request for each pixel 120, and the image quality can improve.

In the present embodiment, two types of gate voltages are used, but three or more types of gate voltages may be used. In such a case, the occurrence of blooming and the saturation charge amount can be finely adjusted for each pixel.

Modification (1) of First Embodiment

In the pixel circuit 1 according to the first embodiment, the gate voltage is switched in accordance with a predetermined setting of the gate voltage, but the pixel circuit 1 according to the present modification controls the gate voltage from a post-stage image processing.

The voltage control unit 114 captures images of all areas of the pixel array 121. Then, the voltage control unit 114 specifies a pixel in which blooming has occurred to perform image processing. Then, in a case where blooming has occurred, if the current gate voltage in the pixel 120 in which blooming has occurred is the saturation charge amount priority gate voltage, the voltage control unit 114 determines to change the gate voltage of the discharge transistor 15 of the pixel to the blooming priority gate voltage. Then, the voltage control unit 114 outputs the gate voltage of the pixel 120 in which blooming has occurred to the feedback control unit 113 as the blooming priority gate voltage.

With such a configuration, the occurrence of blooming of the pixel 120 at the location where blooming occurs can be suppressed, and the occurrence of blooming can be reduced while maintaining the image quality.

In the present Example, the voltage control unit 114 determines the pixel 120 in which blooming has occurred, but this determination processing may be executed by an external computer.

Modification (2) of First Embodiment

In the pixel circuit 1 according to the first embodiment, the gate voltage is switched in accordance with a predetermined setting of the gate voltage, but the pixel circuit 1 according to the present modification controls the gate voltage in accordance with an analog gain.

The image sensor 102 can adjust the analog gain. For example, whether to perform 10 bit analog/digital (AD) conversion at 100 mV or to perform 10 bit AD conversion at 50 mV with an increased analog gain can be set.

The voltage control unit 114 receives an input of a specified gain. Then, the voltage control unit 114 adjusts the gate voltage of the discharge transistor 15 such that the saturation charge amount decreases according to the increase in the gain. For example, when the analog gain is doubled, the voltage control unit 114 sets the gate voltage of the discharge transistor 15 such that the saturation charge amount becomes ½.

With such a configuration, it is possible to suppress generation of unnecessary charges while suppressing blooming.

Modification (3) of First Embodiment

In the above description, the gate voltage of the discharge transistor 15 is variable, but the gate voltage of the transfer transistor 14 may be variable together with the gate voltage of the reset transistor 11. By adopting such a configuration, it is also possible to discharge holes accumulated in the SN 21 by forming an overflow path in the transfer transistor 14.

Modification (4) of First Embodiment

Figure 5:
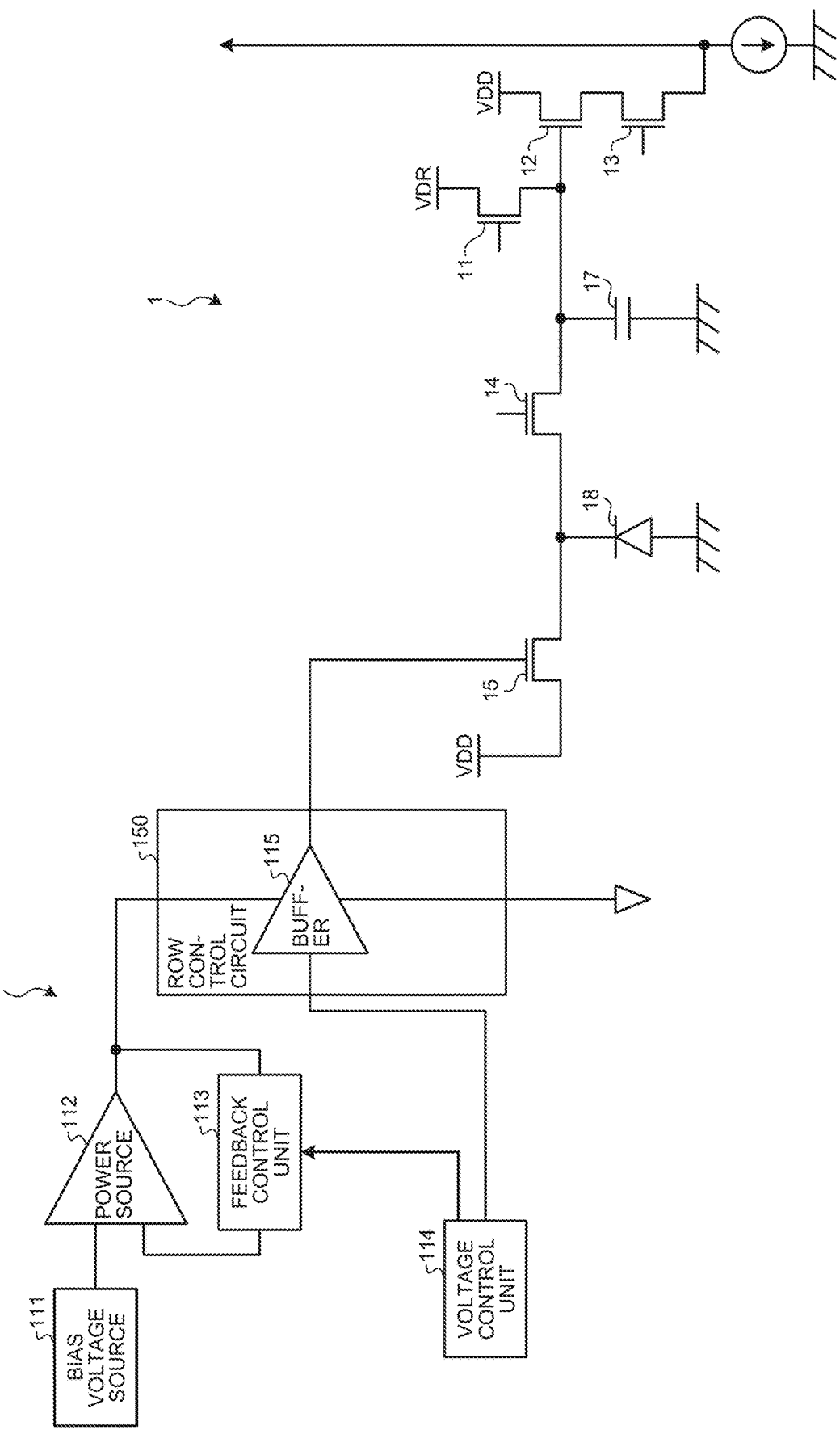
FIG. 5 is a circuit diagram illustrating an example of a pixel circuit using a photodiode.

In the above description, the pixel circuit 1 including the photoelectric conversion film 10 in which the InGaAs sensor is used has been described, but the present invention can also be applied to the pixel circuit 1 in which a photodiode 18 is disposed on a silicon semiconductor substrate as illustrated in FIG. 5. FIG. 5 is a circuit diagram illustrating an example of a pixel circuit using a photodiode. The pixel circuit 1 in FIG. 5 includes the photodiode 18 disposed on a silicon substrate. The electrons generated by the photodiode 18 are accumulated and held in the discharge transistor 15. The photodiode 18 in this case corresponds to an example of "photoelectric conversion unit".

In this case, the discharge transistor 15 is an NMOS. When the discharge transistor 15 is an NMOS, by reducing the potential of the barrier, the barrier becomes high, an overflow path is hardly formed, and the saturation charge amount increases. Conversely, by increasing the potential of the barrier, the barrier becomes low, an overflow path is easily formed, and occurrence of blooming is further suppressed, but the saturation charge amount decreases. A barrier is set in the discharge transistor 15 when a voltage lower than the threshold voltage, which is an off voltage, is applied to the gate.

Modification (5) of First Embodiment

Figure 6:
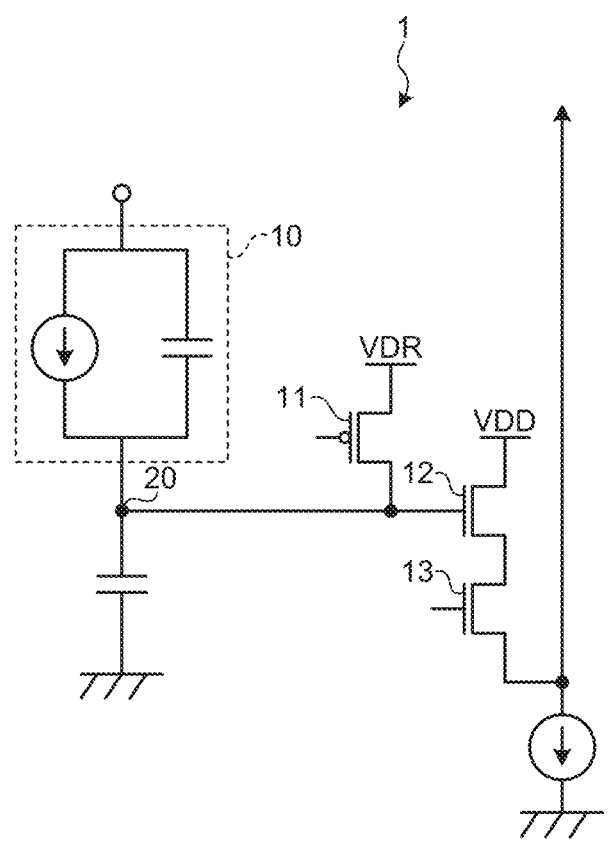
FIG. 6 is a circuit diagram of a three-transistor type pixel circuit.

In the above description, the pixel circuit 1 having the function of the global shutter has been described, but the present invention is also applicable to the pixel circuit 1 having the function of a rolling shutter. FIG. 6 is a circuit diagram of a three-transistor type pixel circuit. For example, when the pixel circuit 1 including three transistors illustrated in FIG. 6 is used, it is possible to suppress the occurrence of blooming and adjust the saturation charge amount by changing the gate voltage of the reset transistor 11.

2. Second Embodiment

Figure 7:
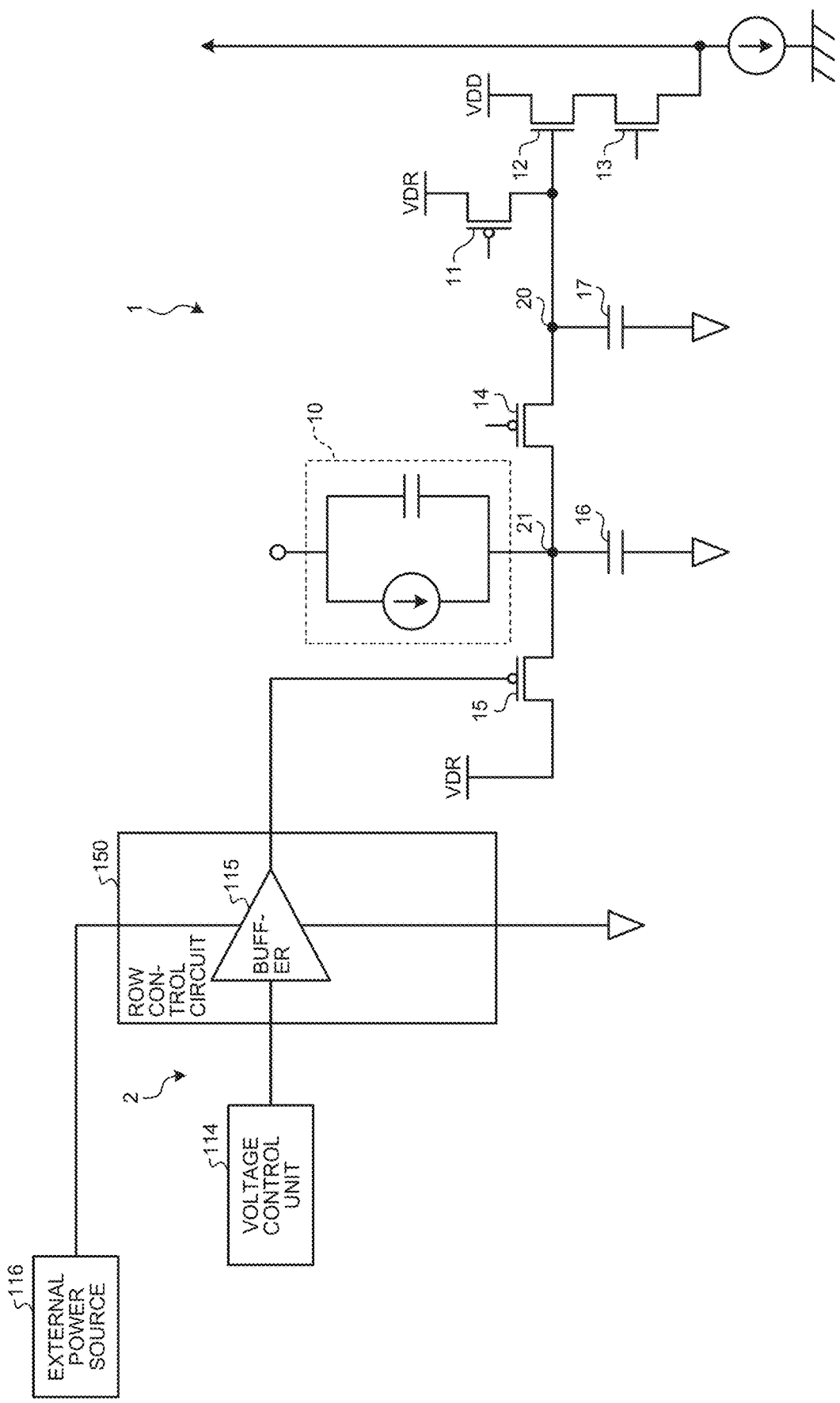
FIG. 7 is a circuit diagram of a pixel circuit and a voltage control circuit according to a second embodiment.

FIG. 7 is a circuit diagram of a pixel circuit and a voltage control circuit according to a second embodiment. The image sensor 102 according to the embodiment is different from Example 1 in that an external power source adjusts the power source. In the following description, description of the same operation as the operation of each unit in the first embodiment will be omitted.

An external power source 116 is connected to the buffer 115 of the image sensor 102 according to the present embodiment. A voltage to be output is set to the external power source 116 using information of setting of a gate voltage according to a desired saturation charge amount. The external power source 116 outputs the set voltage. Here, FIG. 7 illustrates a state in which the external power source 116 outputs one type of voltage to the row control circuit 150, but in practice, the external power source 116 outputs a plurality of types of voltages to the row control circuit so that a different type of voltage can be selected for each row. For example, the external power source 116 outputs the saturation charge amount priority gate voltage or the blooming priority gate voltage selectable in each row.

The buffer 115 receives and accumulates a voltage input from the external power source 116. Then, the buffer 115 applies the gate voltage to the gate of the discharge transistor 15 in accordance with an on/off pulse signal input from the voltage control unit 114.

As described above, the image sensor 102 according to the present embodiment receives an input of a voltage corresponding to the saturation charge amount from the external power source 116, and applies the voltage to the discharge transistor 15 as the gate voltage. In this manner, it is possible to adjust the gate voltage to be applied to the discharge transistor 15 by using the external power source 116, and it is possible to improve the image quality by adjusting the occurrence of blooming and the saturation charge amount.

In addition, even in a configuration in which the input of the voltage is received from the external power source 116, the gate voltage can be adjusted according to the post-stage image processing similarly to the modification (1) of the first embodiment. In such a case, it is preferable to notify the external power source 116 of information obtained from the post-stage image processing. For example, the determination of the pixel 120 in which blooming occurs by the image processing may be performed by the voltage control unit 114, and the determination result may be notified to the external power source 116.

3. Third Embodiment

Figure 8:
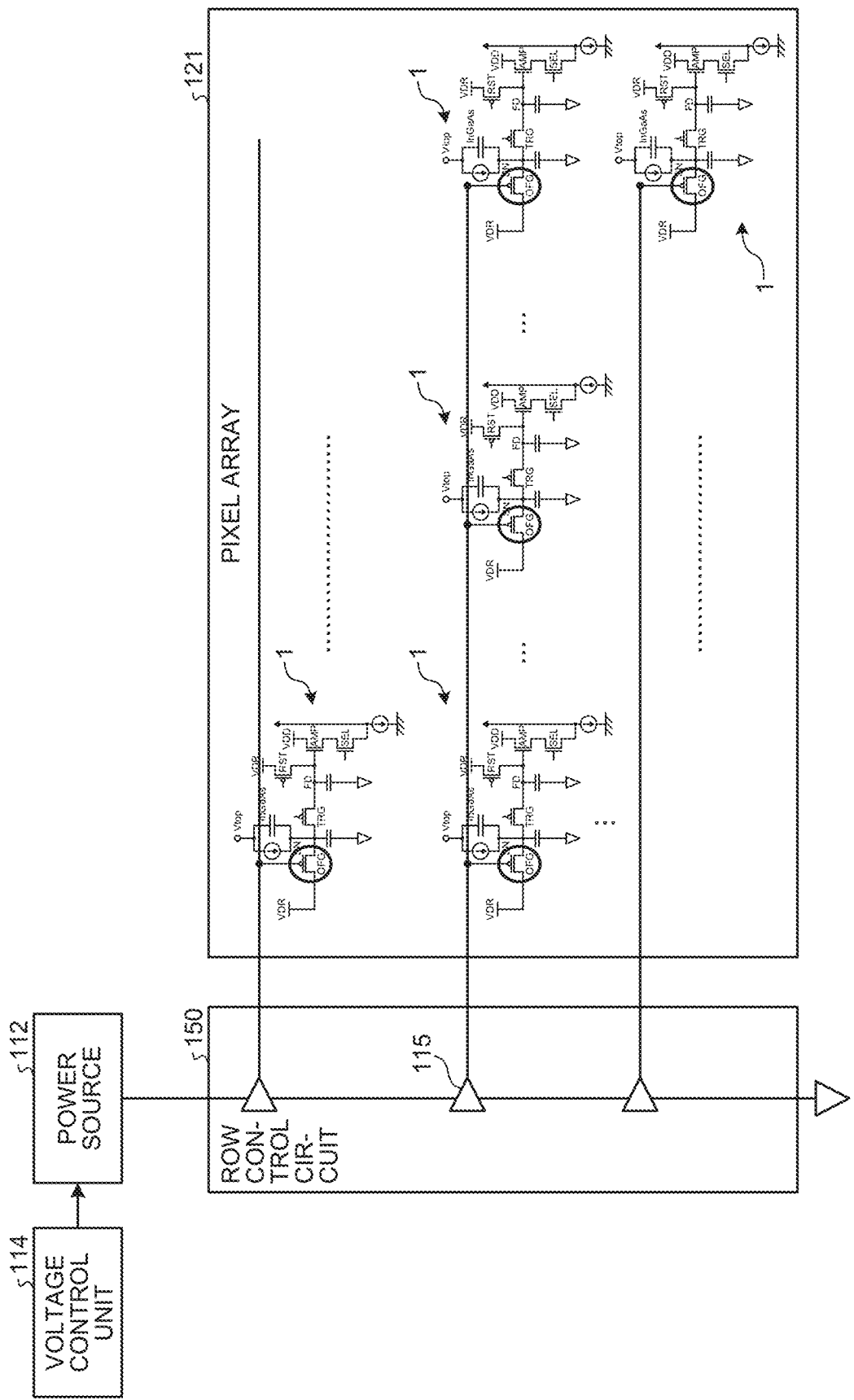
FIG. 8 is a diagram illustrating a connection state of a row control circuit in an image sensor according to a third embodiment.

FIG. 8 is a diagram illustrating a connection state of a row control circuit in an image sensor according to a third embodiment. The image sensor 102 according to the present Example uses the same gate voltage for the discharge transistors 15 of all the pixel circuits 1 included in the pixel array 121.

The power source 112 has one wiring capable of outputting a variable potential to the row control circuit 150. The power source 112 outputs the specified gate voltage to the row control circuit 150 under the control of the voltage control unit 114. For example, a case where the saturation charge amount priority gate voltage and the blooming priority gate voltage are used will be described as an example. When it is desired to suppress blooming in the entire pixel array 121, the power source 112 outputs the blooming priority gate voltage. On the other hand, when it is desired to increase the saturation charge amount in the entire pixel array 121, the power source 112 outputs the saturation charge amount priority gate voltage.

The row control circuit 150 includes the buffer 115 for each row of the pixel array 121. Then, each buffer 115 is connected to the gate of the discharge transistor 15 included in the pixel circuit 1 of each row of the pixel array 121.

The row control circuit 150 receives an input of the gate voltage and holds the gate voltage in each buffer 115. Then, the row control circuit 150 applies the gate voltage held in the buffer 115 according to on/off of each discharge transistor 15. As a result, the same gate voltage is applied to the discharge transistors 15 included in the pixel circuits 1 of all the rows.

As described above, in the image sensor 102 according to the present Example, the same gate voltage is applied to the discharge transistors 15 included in the pixel circuits 1 of all the rows of the pixel array 121. As a result, when it is desired to suppress blooming of the pixel array 121, the gate voltage of a voltage that suppresses blooming is used in the discharge transistors 15 in the pixel circuits 1 of all the pixels 120 of the pixel array 121. In the case of increasing the saturation charge amount of the pixel array 121 to improve image quality, the gate voltage of a voltage that increases the saturation charge amount is used in the discharge transistors 15 in the pixel circuits 1 of all the pixels 120 of the pixel array 121. As a result, the occurrence of blooming can be suppressed, and the saturation charge amount can be adjusted for each pixel array 121.

4. Fourth Embodiment

Figure 9:
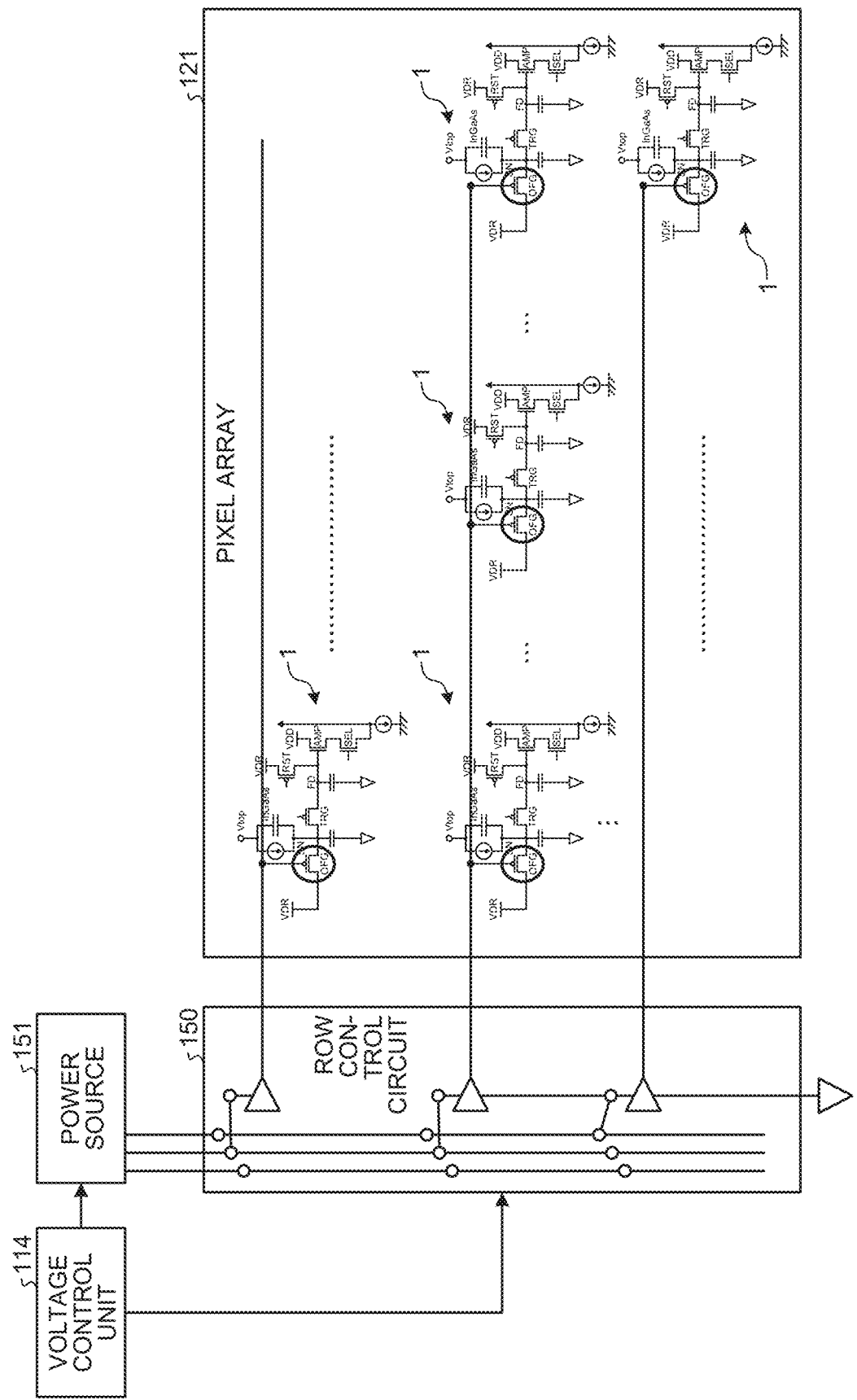
FIG. 9 is a diagram illustrating a connection state of a row control circuit in an image sensor according to a fourth embodiment.

FIG. 9 is a diagram illustrating a connection state of a row control circuit in an image sensor according to a fourth embodiment. The image sensor 102 according to the present Example applies a different gate voltage to each row included in the pixel array 121.

The power source 112 has the same number of wirings capable of outputting a variable potential to the row control circuit 150 as the types of gate voltages. The power source 112 outputs various gate voltages to respective wirings. For example, when three types of voltages are used as the gate voltage, the power source 112 has three wirings extending to the row control circuit 150. Then, the power source 112 outputs three different types of gate voltages to the respective wirings.

The row control circuit 150 includes the buffer 115 for each row of the pixel array 121. Then, each buffer 115 is connected to the gate of the discharge transistor 15 included in the pixel circuit 1 of each row of the pixel array 121. Further, each buffer 115 is connected to a switch capable of selecting one of the wirings extending from the power source 112.

The row control circuit 150 receives an input of setting information of the gate voltage to be applied to each row from the voltage control unit 114. Then, the row control circuit 150 connects the buffer 115 corresponding to each row to the wiring to which the type of gate voltage to be applied to each row is input according to the setting information of the gate voltage of each row.

The row control circuit 150 receives an input of a different type of gate voltage for each wiring and causes each buffer 115 connected to corresponding wiring to hold the voltage input through the wiring. Then, the row control circuit 150 applies the gate voltage held in the buffer 115 to the discharge transistor 15 included in the pixel circuit 1 of each row according to on/off of each discharge transistor 15. As a result, a different gate voltage of the discharge transistor 15 is applied for each row.

As described above, in the image sensor 102 according to the present Example, a different gate voltage is applied to the discharge transistor 15 of the pixel circuit 1 for each row of the pixel array 121. As a result, the occurrence of blooming can be suppressed, and the saturation charge amount can be adjusted for each row of the pixel array 121. For example, a gate voltage for suppressing blooming can be applied to the discharge transistor 15 for a row having the pixel 120 whose blooming is desired to be suppressed, and a gate voltage for increasing the saturation charge amount can be applied to the discharge transistor 15 for a row having the pixel 120 whose saturation charge amount is desired to be increased. This enables the image sensor 102 to generate a more appropriate image.

5. Fifth Embodiment

Figure 10:
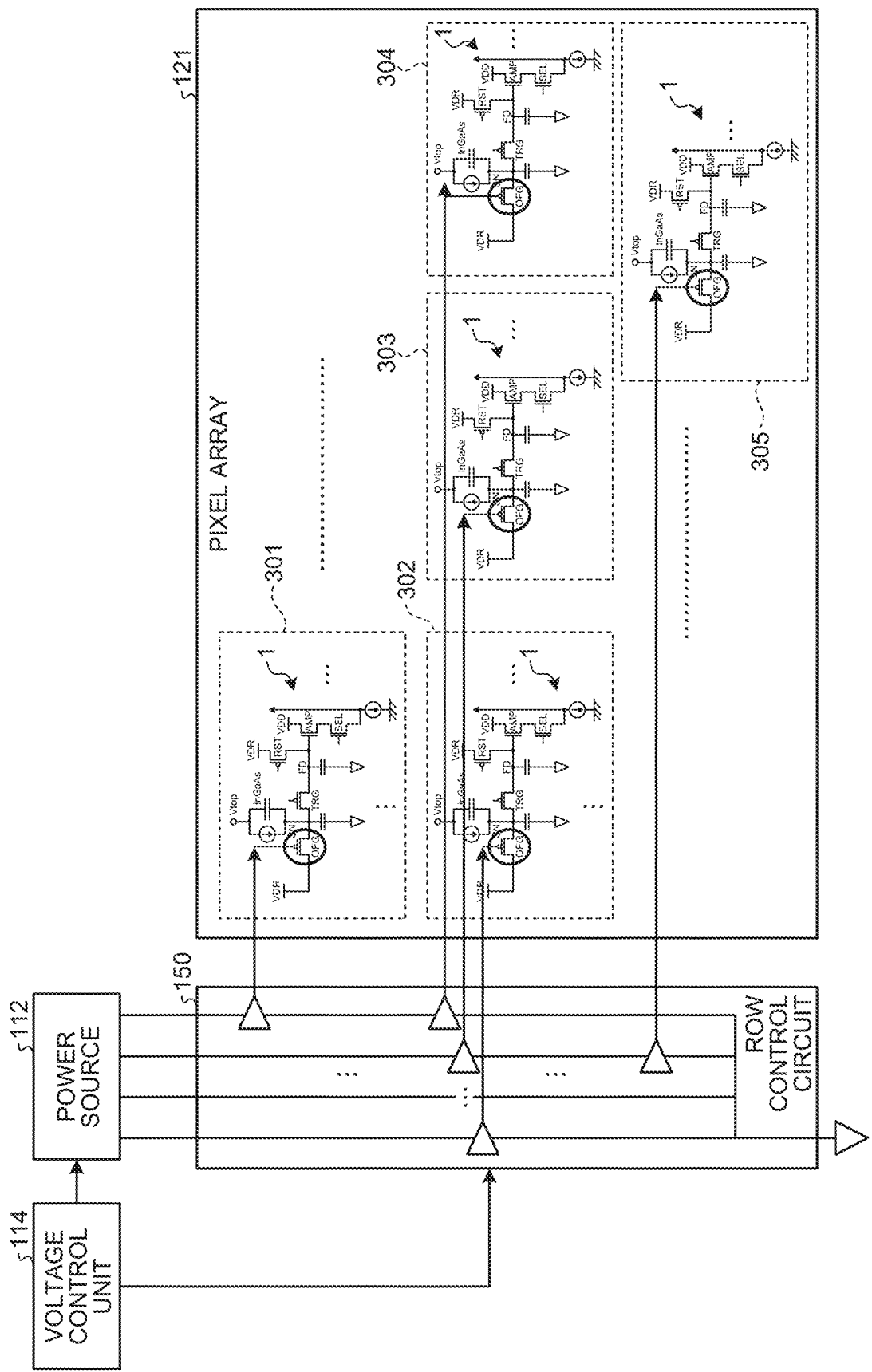
FIG. 10 is a diagram illustrating a connection state of a row control circuit in an image sensor according to a fifth embodiment.

FIG. 10 is a diagram illustrating a connection state of a row control circuit in an image sensor according to a fifth embodiment. The image sensor 102 according to the present Example applies a different gate voltage to each region of the pixel array 121.

The pixel 120 of the pixel array 121 according to the present Example is divided into regions in a lattice pattern, for example. Then, the gate of the discharge transistor 15 included in the pixel circuit 1 of each pixel 120 is connected by one wiring.

The power source 112 has the same number of wirings capable of outputting a variable potential to the row control circuit 150 as the types of gate voltages. The power source 112 outputs various gate voltages to respective wirings. For example, when three types of voltages are used as the gate voltage, the power source 112 has three wirings extending to the row control circuit 150. Then, the power source 112 outputs three different types of gate voltages to the respective wirings.

The row control circuit 150 includes the buffer 115 for each row of the pixel array 121. Then, each buffer 115 is connected to the wiring extending from the gate of the discharge transistor 15 included in the pixel circuit 1 in each region of the pixel array 121. Further, each buffer 115 is connected to a switch capable of selecting one of the wirings extending from the power source 112.

The row control circuit 150 receives an input of setting information of a gate voltage to be applied to each region from the voltage control unit 114. Then, the row control circuit 150 connects the buffer 115 corresponding to each row to the wiring to which the type of gate voltage to be applied to each region is input according to the setting information of the gate voltage of each region.

The row control circuit 150 receives an input of a different type of gate voltage for each wiring and causes each buffer 115 connected to corresponding wiring to hold the voltage input through the wiring. Then, the row control circuit 150 applies the gate voltage held in the buffer 115 to the discharge transistor 15 included in the pixel circuit 1 of each region according to on/off of each discharge transistor 15. As a result, a different gate voltage of the discharge transistor 15 is applied to each region.

As described above, in the image sensor 102 according to the present Example, a different gate voltage is applied to the discharge transistor 15 of the pixel circuit 1 for each region of the pixel array 121. As a result, the occurrence of blooming can be suppressed, and the saturation charge amount can be adjusted for each region of the pixel array 121. For example, a gate voltage for suppressing blooming can be applied to the discharge transistor 15 for a region having the pixel 120 whose blooming is desired to be suppressed, and a gate voltage for increasing the saturation charge amount can be applied to the discharge transistor 15 for a region having the pixel 120 whose saturation charge amount is desired to be increased. As a result, suppression of the occurrence of blooming and the saturation charge amount can be adjusted for each region of the pixel array 121, and a more appropriate image can be generated. Further, by finely dividing the region, suppression of the occurrence of blooming and the saturation charge amount in each pixel can be finely adjusted, and a more appropriate image can be generated.

6. Application Example

Figure 11A:
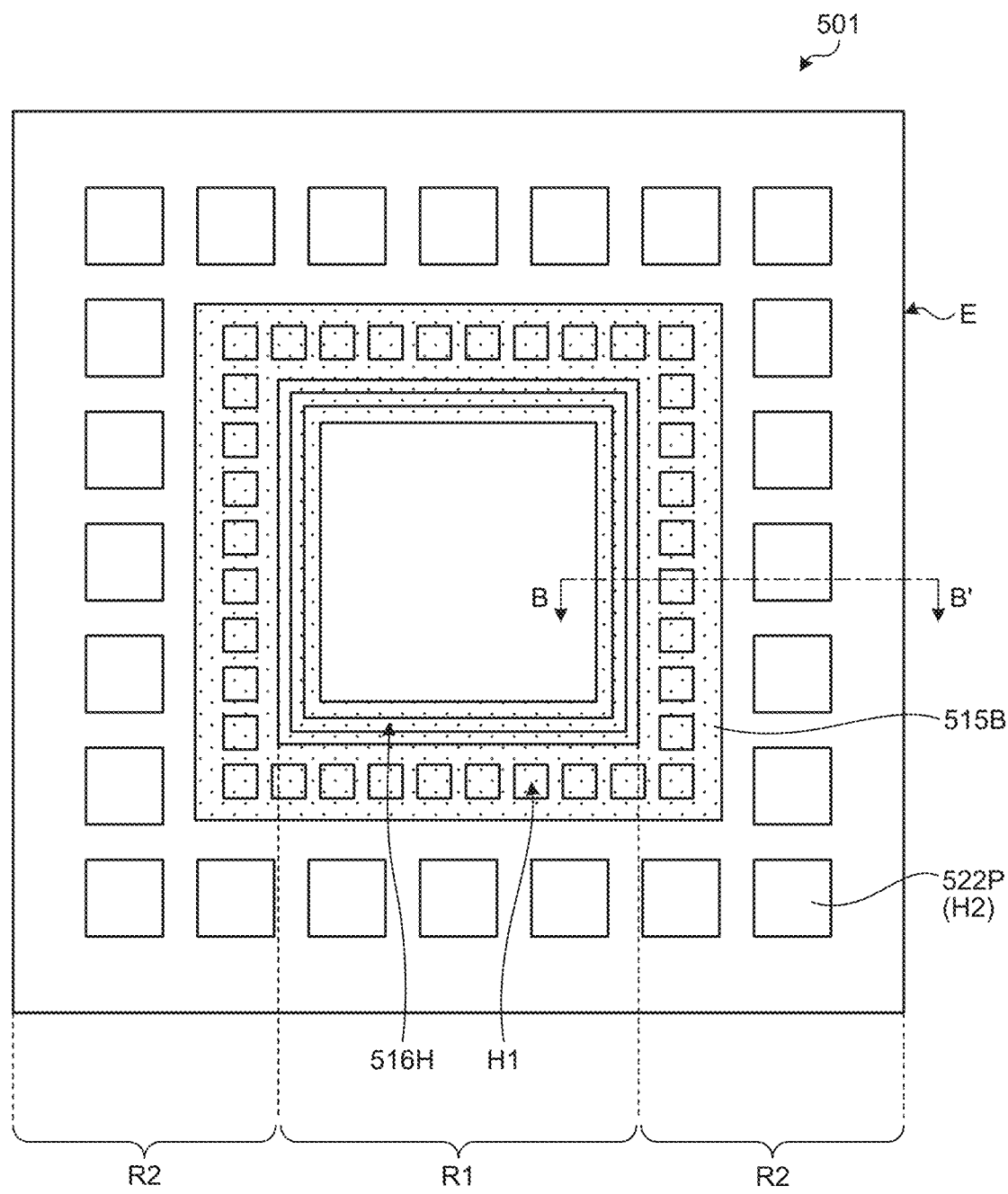
FIG. 11A is a diagram illustrating a planar configuration of a light receiving element.
Figure 11B:
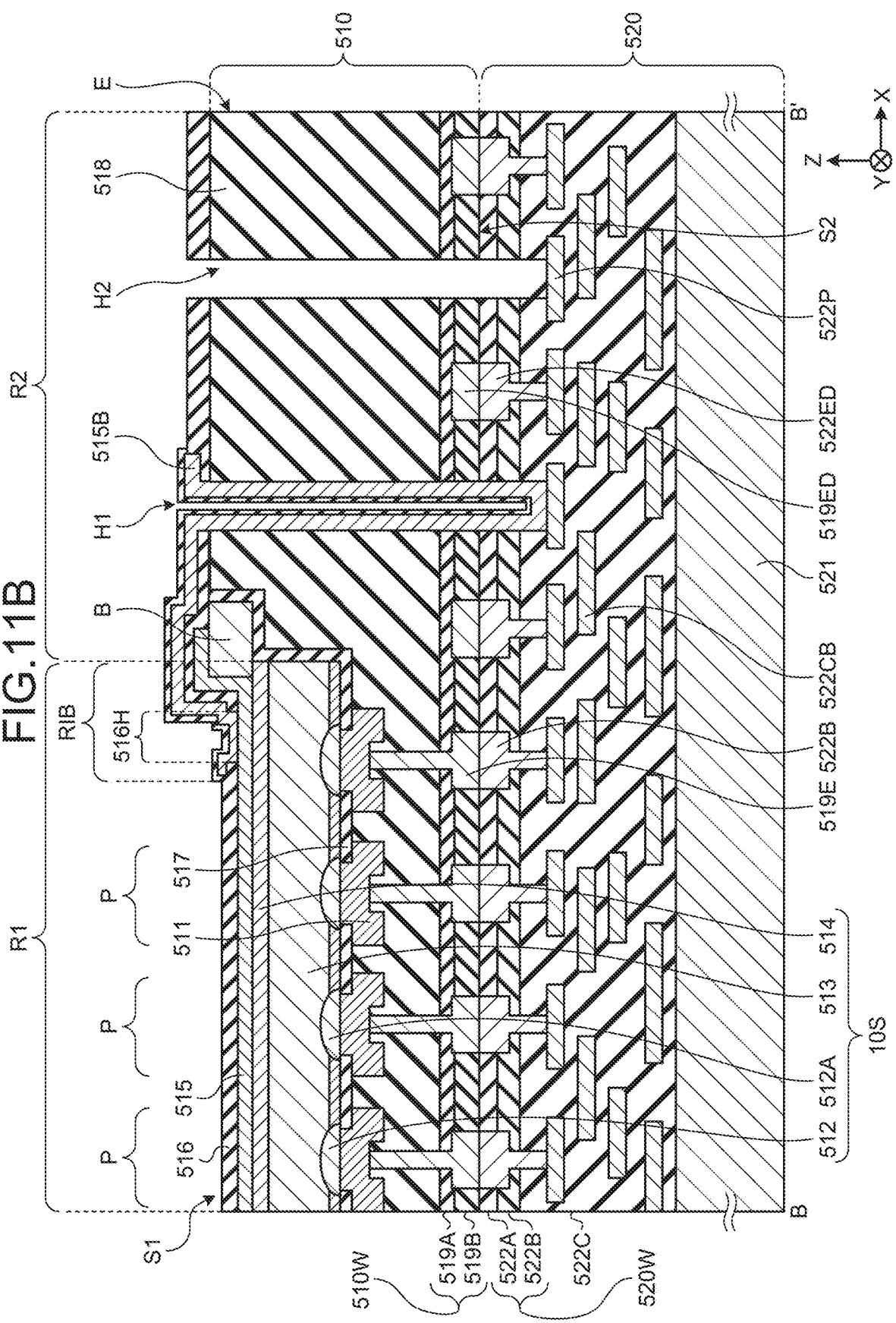
FIG. 11B is a diagram illustrating a cross-sectional configuration taken along the line B-B' in FIG. 11A.

Here, a configuration example to which the pixel circuit 1 described in each of the above embodiments is applicable will be described. FIG. 11A is a diagram illustrating a planar configuration of a light receiving element. FIG. 11B is a diagram illustrating a cross-sectional configuration taken along the line B-B' in FIG. 11A. For example, each pixel circuit 1 described in each embodiment and its modification can be applied to the light receiving element illustrated in FIGS. 11A and 11B.

A light receiving element 501 is applied to, for example, an infrared sensor or the like using a compound semiconductor material such as a group III-V semiconductor and has a photoelectric conversion function for light having a wavelength in a visible region (for example, 380 nm or more and less than 780 nm) to a short infrared region (for example, 780 nm or more and less than 2400 nm). The light receiving element 501 is provided with, for example, a plurality of light receiving unit regions P (pixels P) arranged two-dimensionally (FIG. 11B).

The light receiving element 501 is applied to, for example, an infrared sensor or the like in which a compound semiconductor material such as a group III-V semiconductor is used, and has, for example, a photoelectric conversion function for light having a wavelength in a visible region (for example, 380 nm or more and less than 780 nm) to a short infrared region (for example, 780 nm or more and less than 2400 nm). The light receiving element 501 is provided with, for example, a plurality of light receiving unit regions P (pixels P) arranged two-dimensionally.

The light receiving element 501 includes an element region R1 in a central portion and a peripheral region R2 provided outside the element region R1 and surrounding the element region R1 (FIG. 11A). The light receiving element 501 includes a conductive film 515B provided from the element region R1 to the peripheral region R2. The conductive film 515B has an opening in a region facing the central portion of the element region R1.

The light receiving element 501 has a stacked structure of an element substrate 510 and a readout circuit substrate 520. One surface of the element substrate 510 is a light incident surface (light incident surface S1), and a surface (the other surface) opposite to the light incident surface S1 is a junction surface (junction surface S2) with the readout circuit substrate 520.

The element substrate 510 includes a wiring layer 510W, a first electrode 511, a semiconductor layer 510S (first semiconductor layer), a second electrode 515, and a passivation film 516 in this order from a position close to the readout circuit substrate 520. A surface of the semiconductor layer 510S facing the wiring layer 510W and an end surface (side surface) are covered with an insulating film 517. The readout circuit substrate 520 is a so-called readout integrated circuit (ROIC), and includes a wiring layer 520W and a multilayer wiring layer 522C in contact with the junction surface S2 of the element substrate 510, and a semiconductor substrate 521 facing the element substrate 510 with the wiring layer 520W and the multilayer wiring layer 522C interposed therebetween.

The element substrate 510 includes a semiconductor layer 510S in the element region R1. In other words, the region where the semiconductor layer 510S is provided is the element region R1 of the light receiving element 501. In the element region R1, a region exposed from the conductive film 515B (a region facing the opening of the conductive film 515B) is a light receiving region. A region covered with the conductive film 515B in the element region R1 is an optical black (OPB) region R1B. The OPB region R1B is provided in such a manner as to surround the light receiving region. The OPB region RIB is used to obtain a black-level pixel signal. The element substrate 510 has an embedded layer 518 together with the insulating film 517 in the peripheral region R2. The peripheral region R2 is provided with holes H1 and H2 that penetrate the element substrate 510 and reach the readout circuit substrate 520. In the light receiving element 501, light is incident on the semiconductor layer 510S from the light incident surface S1 of the element substrate 510 via the passivation film 516, the second electrode 515, and a second contact layer 514. The signal charge photoelectrically converted in the semiconductor layer 510S moves via the first electrode 511 and the wiring layer 510W and is read out by the readout circuit substrate 520. Hereinafter, the configuration of each unit will be described.

The wiring layer 510W is provided over the element region R1 and the peripheral region R2, and has the junction surface S2 with the readout circuit substrate 520. In the light receiving element 501, the junction surface S2 of the element substrate 510 is provided in the element region R1 and the peripheral region R2, and for example, the junction surface S2 of the element region R1 and the junction surface S2 of the peripheral region R2 form the same plane. As described later, in the light receiving element 501, the embedded layer 518 is provided to form the junction surface S2 of the peripheral region R2.

The wiring layer 510W includes a contact electrode 519E and a dummy electrode 519ED, for example in interlayer insulating films 519A and 519B. For example, the interlayer insulating film 519B is disposed on the readout circuit substrate 520 side, and the interlayer insulating film 519A is disposed on a first contact layer 512 side, and these interlayer insulating films 519A and 519B are provided in a stacked manner. The interlayer insulating films 519A and 519B are made of, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 519A and 519B may be made of the same inorganic insulating material.

The contact electrode 519E is provided in the element region R1, for example. The contact electrode 519E is for electrically connecting the first electrode 511 and the readout circuit substrate 520, and is provided in the element region R1 for each pixel P. The adjacent contact electrodes 519E are electrically separated by the embedded layer 518 and the interlayer insulating films 519A and 519B. The contact electrode 519E is made of, for example, a copper (Cu) pad, and is exposed on the junction surface S2. The dummy electrode 519ED is provided in the peripheral region R2, for example. The dummy electrode 519ED is connected to a dummy electrode 522ED of a wiring layer 520W described later. Providing the dummy electrode 519ED and the dummy electrode 522ED enables the strength of the peripheral region R2 to improve. The dummy electrode 519ED is formed in the same process as the contact electrode 519E, for example. The dummy electrode 519ED is made of, for example, a copper (Cu) pad, and is exposed on the junction surface S2.

The first electrode 511 provided between the contact electrode 519E and the semiconductor layer 510S is an electrode (anode) to which a voltage for reading out signal charges (holes or electrons, hereinafter, for convenience, description will be made on the assumption that the signal charges are holes) generated in a photoelectric conversion layer 513 is supplied, and is provided in the element region R1 for each pixel P. The first electrode 511 is provided in such a manner as to fill the opening of the insulating film 517 and is in contact with the semiconductor layer 510S (more specifically, a diffusion region 512A described later). The first electrode 511 is, for example, larger than the opening of the insulating film 517, and a part of the first electrode 511 is provided in the embedded layer 518. That is, the upper surface of the first electrode 511 (surface on the semiconductor layer 510S side) is in contact with the diffusion region 512A, and the lower surface and a part of the side surface of the first electrode 511 are in contact with the embedded layer 518. The adjacent first electrodes 511 are electrically separated by the insulating film 517 and the embedded layer 518.

The first electrode 511 is made of, for example, any single substance of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of these elements. The first electrode 511 may be a single film of such a constituent material or may be a stacked film obtained by combining two or more kinds. For example, the first electrode 511 is made of a stacked film of titanium and tungsten. The thickness of the first electrode 511 is, for example, several tens nm to several hundreds nm.

The semiconductor layer 510S includes, for example, the first contact layer 512, the photoelectric conversion layer 513, and the second contact layer 514 from a position close to the wiring layer 510W. The first contact layer 512, the photoelectric conversion layer 513, and the second contact layer 514 have the same planar shape, and end surfaces thereof are disposed at the same position in plan view.

The first contact layer 512 is provided, for example, in common for all the pixels P, and is disposed between the insulating film 517 and the photoelectric conversion layer 513. The first contact layer 512 is for electrically separating adjacent pixels P, and the first contact layer 512 is provided with, for example, a plurality of diffusion regions 512A. Using a compound semiconductor material having a band gap larger than the band gap of the compound semiconductor material constituting the photoelectric conversion layer 513 for the first contact layer 512 enables dark current to be suppressed. For example, n-type indium phosphide (InP) can be used for the first contact layer 512.

The diffusion regions 512A provided in the first contact layer 512 are disposed apart from each other. The diffusion region 512A is disposed for each pixel P, and the first electrode 511 is connected to each diffusion region 512A. The diffusion region 512A is also provided in the OPB region R1B. The diffusion region 512A is for reading out signal charges generated in the photoelectric conversion layer 513 for each pixel P, and contains, for example, a p-type impurity. Examples of the p-type impurity include Zn (zinc). In this manner, a pn junction interface is formed between the diffusion region 512A and the first contact layer 512 other than the diffusion region 512A, and the adjacent pixels P are electrically separated. The diffusion region 512A is provided, for example, in the thickness direction of the first contact layer 512 and is also provided in a part of the photoelectric conversion layer 513 in the thickness direction.

The photoelectric conversion layer 513 between the first electrode 511 and the second electrode 515, more specifically, between the first contact layer 512 and the second contact layer 514 is provided in common for all the pixels P, for example. The photoelectric conversion layer 513 absorbs light having a predetermined wavelength and generates signal charges, and is made of, for example, a compound semiconductor material such as an i-type group III-V semiconductor. Examples of the compound semiconductor material constituting the photoelectric conversion layer 513 include InGaAs (indium gallium arsenide), InAsSb (indium arsenide antimony), InAs (indium arsenide), InSb (indium antimony), and HgCdTe (mercury cadmium telluride). The photoelectric conversion layer 513 may be made of Ge (germanium). In the photoelectric conversion layer 513, for example, light having a wavelength in a visible region to a short infrared region is photoelectrically converted.

The second contact layer 514 is provided in common for all the pixels P, for example. The second contact layer 514 is provided between and in contact with the photoelectric conversion layer 513 and the second electrode 515. The second contact layer 514 is a region where charges discharged from the second electrode 515 move, and is made of, for example, a compound semiconductor containing n-type impurities. For example, n-type indium phosphide (InP) can be used for the second contact layer 514.

The second electrode 515 is provided on the second contact layer 514 (light incident side) in such a manner as to be in contact with the second contact layer 514, for example, as an electrode common to the respective pixels P. The second electrode 515 is for discharging charges that are not used as signal charges (cathode) among the charges generated in the photoelectric conversion layer 513. For example, when holes are read out from the first electrode 511 as signal charges, for example, electrons can be discharged through the second electrode 515. The second electrode 515 is made of, for example, a conductive film capable of transmitting incident light such as infrared rays. For example, ITO (indium tin oxide), ITiO ($In_2O_3$—$TiO_2$), or the like can be used for the second electrode 515. For example, the second electrodes 515 may be provided in a lattice shape in such a manner as to partition the adjacent pixels P. For the second electrode 515, a conductive material having low optical transparency can be used.

The passivation film 516 covers the second electrode 515 from the light incident surface S1 side. The passivation film 516 may have an antireflection function. For the passivation film 516, for example, silicon nitride (SiN), aluminum oxide ($Al_2O_3$), silicon oxide ($SiO_2$), tantalum oxide ($Ta_2O_2$), or the like can be used. The passivation film 516 has an opening 516H in the OPB region R1B. The opening 516H is provided, for example, in a frame shape surrounding the light receiving region (FIG. 11A). The opening 516H may be, for example, a quadrangular or circular hole in plan view. The conductive film 515B is electrically connected to the second electrode 515 through the opening 516H of the passivation film 516.

The insulating film 517 is provided between the first contact layer 512 and the embedded layer 518, covers the end surface of the first contact layer 512, the end surface of the photoelectric conversion layer 513, the end surface of the second contact layer 514, and the end surface of the second electrode 515, and is in contact with the passivation film 516 in the peripheral region R2. The insulating film 517 includes, for example, an oxide such as silicon oxide ($SiO_X$) or aluminum oxide ($Al_2O_3$). The insulating film 517 may be configured by a stacked structure including a plurality of films. The insulating film 517 may be made of a silicon (Si)-based insulating material such as silicon oxynitride (SiON), carbon-containing silicon oxide (SiOC), silicon nitride (SiN), and silicon carbide (SiC). The thickness of the insulating film 517 is, for example, several tens nm to several hundreds nm.

The conductive film 515B is provided from the OPB region R1B to the hole H1 in the peripheral region R2. The conductive film 515B is in contact with the second electrode 515 at the opening 516H of the passivation film 516 provided in the OPB region R1B and is in contact with wiring (a wiring 522CB described later) of the readout circuit substrate 520 via the hole H1. As a result, a voltage is supplied from the readout circuit substrate 520 to the second electrode 515 via the conductive film 515B. The conductive film 515B functions as a voltage supply path to the second electrode 515 and also functions as a light shielding film to form the OPB region R1B. The conductive film 515B is made of, for example, a metal material containing tungsten (W), aluminum (Al), titanium (Ti), molybdenum (Mo), tantalum (Ta), or copper (Cu). A passivation film may be provided on the conductive film 515B.

An adhesive layer B may be provided between an end portion of the second contact layer 514 and the second electrode 515. As described later, the adhesive layer B is used when the light receiving element 501 is formed and plays a role of joining the semiconductor layer 510S to a temporary substrate. The adhesive layer B is made of, for example, tetraethoxysilane (TEOS), silicon oxide ($SiO_2$), or the like. For example, the adhesive layer B is provided to be wider than the end surface of the semiconductor layer 510S and is covered with the embedded layer 518 together with the semiconductor layer 510S. The insulating film 517 is provided between the adhesive layer B and the embedded layer 518.

The embedded layer 518 is used to fill the step between the temporary substrate and the semiconductor layer 510S in the manufacturing process of the light receiving element 501. Although details will be described later, in the present embodiment, since the embedded layer 518 is formed, the occurrence of defects in the manufacturing process caused by the step between the semiconductor layer 510S and a temporary substrate 533 is suppressed.

The embedded layer 518 in the peripheral region R2 is provided between the wiring layer 10W and the insulating film 517 and between the wiring layer 510W and the passivation film 516 and has a thickness equal to or larger than the thickness of the semiconductor layer 510S, for example. Here, since the embedded layer 518 is provided to surround the semiconductor layer 510S, a region (peripheral region R2) around the semiconductor layer 510S is formed. This enables the junction surface S2 with the readout circuit substrate 520 to be provided in the peripheral region R2. As long as the junction surface S2 is formed in the peripheral region R2, the thickness of the embedded layer 518 may be reduced, but it is preferable that the embedded layer 518 cover the semiconductor layer 510S in the thickness direction, and the entire end surface of the semiconductor layer 510S be covered with the embedded layer 518. The embedded layer 518 covering the entire end surface of the semiconductor layer 510S via the insulating film 517 can effectively suppress the infiltration of moisture into the semiconductor layer 510S. The embedded layer 518 in the element region R1 is provided between the semiconductor layer 510S and the wiring layer 510W in such a manner as to cover the first electrode 511.

The surface of the embedded layer 518 on the junction surface S2 side is planarized, and in the peripheral region R2, the wiring layer 510W is provided on the planarized surface of the embedded layer 518. For the embedded layer 518, for example, an inorganic insulating material such as silicon oxide ($SiO_X$), silicon nitride (SiN), silicon oxynitride (SiON), carbon-containing silicon oxide (SiOC), or silicon carbide (SiC) can be used.

In the process of manufacturing the light receiving element 501, after the embedded layer 518 is formed, the wiring layer 510W including the interlayer insulating films 519A and 519B and the contact electrode 519E is formed above the embedded layer 518. The readout circuit substrate 520 including the wiring layer 520W is bonded to the element substrate 510 including the wiring layer 510W to form the light receiving element 501. At this time, the contact electrode 519E of the wiring layer 510W and a contact electrode 522E of the wiring layer 520W are connected. The contact electrodes 519E and 522E have, for example, Cu pads, and the contact electrodes 519E and 522E are connected by direct junction of the Cu pads. When the contact electrode 519E is formed using a chemical mechanical polishing (CMP) method, the embedded layer 518 disposed below the copper film to be polished is required to have hardness that can withstand stress during polishing. In addition, in order to directly junction the Cu pads of the contact electrodes 519E and 522E to each other, it is necessary to form the element substrate 510 and the readout circuit substrate 520 extremely flat. For this reason, the embedded layer 518 disposed below the copper film preferably has hardness that can withstand stress during polishing. Specifically, a constituent material of the embedded layer 518 is preferably a material having higher hardness than a sealant or an organic material disposed around a die in a general semiconductor package. Examples of the material having such high hardness include an inorganic insulating material. The embedded layer 518 can be formed by forming a film of the inorganic insulating material by, for example, a chemical vapor deposition (CVD) method, a sputtering method, or a coating method.

The embedded layer 518 is provided with the holes H1 and H2 penetrating the embedded layer 518. The holes H1 and H2 penetrate the wiring layer 510W together with the embedded layer 518 and reach the readout circuit substrate 520. The holes H1 and H2 have, for example, a quadrangular planar shape, and a plurality of holes H1 and a plurality of holes H2 are provided to surround the element region R1 (FIG. 11A). The hole H1 is provided at a position closer to the element region R1 than the hole H2, and the side wall and the bottom surface of the hole H1 are covered with the conductive film 515B. The hole H1 is for connecting the second electrode 515 (conductive film 515B) and a wiring (a wiring 522CB described later) of the readout circuit substrate 520, and is provided penetrating the passivation film 516, the embedded layer 518, and the wiring layer 510W.

The hole H2 is provided, for example, at a position closer to a chip end E than the hole H1. The hole H2 penetrates the passivation film 516, the embedded layer 518, and the wiring layer 510W and reaches a pad electrode (a pad electrode 522P described later) of the readout circuit substrate 520. The outside and the light receiving element 501 are electrically connected through the hole H2. The holes H1 and H2 do not have to reach the readout circuit substrate 520. For example, the holes H1 and H2 may reach the wiring of the wiring layer 510W, and the wiring may be connected to the wiring 522CB of the readout circuit substrate 520 and the pad electrode 522P. The holes H1 and H2 may penetrate the adhesive layer B.

Holes and electrons generated in the photoelectric conversion layer 513 are read out from the first electrode 511 and the second electrode 515. In order to perform this readout operation at a high speed, it is preferable to set the distance between the first electrode 511 and the second electrode 515 to a distance sufficient for photoelectric conversion and not excessively separated. That is, it is preferable to reduce the thickness of the element substrate 510. For example, the distance between the first electrode 511 and the second electrode 515 or the thickness of the element substrate 510 is 10 µm or less, further 7 µm or less, and further 5 µm or less.

The semiconductor substrate 521 of the readout circuit substrate 520 faces the element substrate 510 with the wiring layer 520W and the multilayer wiring layer 522C interposed therebetween. The semiconductor substrate 521 is made of, for example, silicon (Si). A plurality of transistors are provided in the vicinity of the surface of the semiconductor substrate 521 (the surface on the wiring layer 520W side). For example, a readout circuit is configured for each pixel P using the plurality of transistors. As this readout circuit, the pixel circuit 1 described in each embodiment and modification can be used. The wiring layer 520W includes, for example, an interlayer insulating film 522A and an interlayer insulating film 522B in this order from the element substrate 510 side, and these interlayer insulating films 522A and 522B are provided in a stacked manner. For example, the contact electrode 522E and the dummy electrode 522ED are provided in the interlayer insulating film 522A. The multilayer wiring layer 522C is provided to face the element substrate 510 with the wiring layer 520W therebetween. For example, the pad electrode 522P and a plurality of wirings 522CB are provided in the multilayer wiring layer 522C. The interlayer insulating films 522A and 522B are made of, for example, an inorganic insulating material. Examples of the inorganic insulating material include silicon nitride (SiN), aluminum oxide ($Al_2O_3$), silicon oxide ($SiO_2$), and hafnium oxide ($HfO_2$).

The contact electrode 522E is for electrically connecting the first electrode 511 and the wiring 522CB, and is provided in the element region R1 for each pixel P. The contact electrode 522E is in contact with the contact electrode 519E at the junction surface S2 of the element substrate 510. The adjacent contact electrodes 522E are electrically separated by the interlayer insulating film 522A.

The dummy electrode 522ED provided in the peripheral region R2 is in contact with the dummy electrode 519ED at the junction surface S2 of the element substrate 510. The dummy electrode 522ED is formed in the same process as the contact electrode 522E, for example. The contact electrode 522E and the dummy electrode 522ED are made of, for example, a copper (Cu) pad, and are exposed on a surface of the readout circuit substrate 520 facing the element substrate 510. That is, for example, CuCu junction is performed between the contact electrode 519E and the contact electrode 522E and between the dummy electrode 519ED and the dummy electrode 522ED. This enables the pixel P to be miniaturized.

The wiring 522CB connected to the contact electrode 519E is connected to a transistor provided in the vicinity of the surface of the semiconductor substrate 521, and the first electrode 511 and the readout circuit are connected for each pixel P. The wiring 522CB connected to the conductive film 515B via the hole H1 is connected to, for example, a predetermined potential. In this manner, one (for example, a hole) of the charges generated in the photoelectric conversion layer 513 is read out from the first electrode 511 to the readout circuit via the contact electrodes 519E and 522E, and the other (for example, an electron) of the charges generated in the photoelectric conversion layer 513 is discharged from the second electrode 515 to a predetermined potential via the conductive film 515B.

The pad electrode 522P provided in the peripheral region R2 is for electrically connecting to the outside. The hole H2 that penetrates the element substrate 510 and reaches the pad electrode 522P is provided in the vicinity of the chip end E of the light receiving element 501, and is electrically connected to the outside via the hole H2. The connection is made by, for example, a method such as wire bond or bump. For example, a predetermined potential may be supplied from an external terminal disposed in the hole H2 to the second electrode 515 via the hole H2, the wiring 522CB of the readout circuit substrate 520, and the conductive film 515B. As a result of photoelectric conversion in the photoelectric conversion layer 513, a signal voltage read out from the first electrode 511 may be read out to a readout circuit of the semiconductor substrate 521 via the contact electrodes 519E and 522E, and may be output to the external terminal disposed in the hole H2 via the readout circuit. The signal voltage may be output to the external terminal together with the readout circuit via, for example, other circuits included in the readout circuit substrate 520. The other circuits are, for example, a signal processing circuit, an output circuit, and the like.

The thickness of the readout circuit substrate 520 is preferably larger than the thickness of the element substrate 510. For example, the thickness of the readout circuit substrate 520 is preferably two times or more, more preferably five times or more, and still more preferably ten times or more larger than the thickness of the element substrate 510. Alternatively, the thickness of the readout circuit substrate 520 is, for example, 100 µm or more, 150 µm or more, or 200 µm or more. The readout circuit substrate 520 having such a large thickness ensures the mechanical strength of the light receiving element 501. Note that the readout circuit substrate 520 may include only one layer of the semiconductor substrate 521 forming the circuit, or may further include a substrate such as a support substrate in addition to the semiconductor substrate 521 forming the circuit.

FIG. 12 is a diagram illustrating a cross-sectional configuration of another light receiving element. For example, each pixel circuit 1 described in each embodiment and its modification can be applied to the light receiving element illustrated in FIG. 12.

In FIG. 12, each pixel 602 in the pixel array region is divided into a normal pixel 602A or a charge release pixel 602B depending on a difference in control of the reset transistor, but the pixel structure is the same in both the normal pixel 602A and the charge release pixel 602B, and thus will be simply described as the pixel 602. The charge release pixel 602B is disposed on the outermost side of the pixel array region.

The readout circuit of a capacitance element, the reset transistor, the amplification transistor, and the selection transistor of each pixel 602 is formed for each pixel on a semiconductor substrate 612 made of a single crystal material such as single crystal silicon (Si).

An N-type semiconductor thin film 641 is formed on the entire surface of the pixel array region on the upper side which is the light incident side of the semiconductor substrate 612. As the N-type semiconductor thin film 641, InGaP, InAlP, InGaAs, InAlAs, or a compound semiconductor having a chalcopyrite structure is used. The compound semiconductor having a chalcopyrite structure is a material capable of obtaining a high light absorption coefficient and high sensitivity over a wide wavelength range and is preferably used as the N-type semiconductor thin film 641 for photoelectric conversion. The compound semiconductor having such a chalcopyrite structure is configured using elements around group IV elements such as Cu, Al, Ga, In, S, and Se, and examples thereof include a CuGaInS-based mixed crystal, a CuAlGaInS-based mixed crystal, and a CuAlGaInSSe-based mixed crystal. The pixel circuit 1 described in each embodiment and each modification can be applied as the readout circuit disposed on the semiconductor substrate 612.

As a material of the N-type semiconductor thin film 641, amorphous silicon (Si), germanium (Ge), a quantum (Q) dot photoelectric conversion film, an organic photoelectric conversion film, or the like can be used in addition to the compound semiconductor described above. Here, it is assumed that a compound semiconductor of InGaAs is used as the N-type semiconductor thin film 641.

On the lower side of the N-type semiconductor thin film 641, which is on the semiconductor substrate 612 side, a high-concentration P-type layer 642 constituting a pixel electrode is formed for each pixel. Then, between the high-concentration P-type layers 642 formed for each pixel, an N-type layer 643 as a pixel separation region that separates each pixel 602 is formed of, for example, a compound semiconductor such as InP. The N-type layer 643 has a function of preventing dark current in addition to a function as a pixel separation region.

On the other hand, an N-type layer 644 having a higher concentration than that of the N-type semiconductor thin film 641 is also formed on the upper side of the N-type semiconductor thin film 641, which is on the light incident side, by using a compound semiconductor such as InP used as the pixel separation region. The high-concentration N-type layer 644 functions as a barrier layer that prevents a reverse flow of charges generated in the N-type semiconductor thin film 641. As a material of the high-concentration N-type layer 644, for example, a compound semiconductor such as InGaAs, InP, or InAlAs can be used.

An antireflection film 645 is formed on the high-concentration N-type layer 644 as a barrier layer. As a material of the antireflection film 645, for example, silicon nitride (SiN), hafnium oxide ($HfO_2$), aluminum oxide ($Al_2O_3$), zirconium oxide ($ZrO_2$), tantalum oxide ($Ta_2Ta_5$), titanium oxide ($TiO_2$), or the like can be used.

Either one of the high-concentration N-type layer 644 and the antireflection film 645 also functions as an upper electrode on the upper side among the electrodes vertically sandwiching the N-type semiconductor thin film 641, and a predetermined voltage Va is applied to the high-concentration N-type layer 644 or the antireflection film 645 as the upper electrode.

A color filter 646 and an on-chip lens 647 are further formed on the antireflection film 645. The color filter 646 is a filter that transmits light (wavelength light) of any of red (R), green (G), and blue (B), and is arranged in a so-called Bayer array in the pixel array region, for example.

A passivation layer 651 and an insulating layer 652 are formed below the high-concentration P-type layer 642 constituting the pixel electrode and the N-type layer 643 as the pixel separation region. Connection electrodes 653A and 653B and a bump electrode 654 are formed in such a manner as to penetrate the passivation layer 651 and the insulating layer 652. The connection electrodes 653A and 653B and the bump electrode 654 electrically connect the high-concentration P-type layer 642 constituting the pixel electrode and a capacitance element 622 that accumulates charges.

The normal pixel 602A and the charge release pixel 602B are configured as described above and have the same pixel structure. However, the method of controlling the reset transistor is different between the normal pixel 602A and the charge release pixel 602B.

In the normal pixel 602A, the reset transistor is turned on and off on the basis of the reset signal according to the period of charge generation (light receiving period) by the photoelectric conversion unit, the reset period of the potential of the capacitance element before the start of light reception, and the like, but in the charge release pixel 602B, the reset transistor is always controlled to be turned on. As a result, the charge generated in the photoelectric conversion unit is discharged to the ground, and the constant voltage Va is always applied to the charge release pixel 602B.

7. Application Example to Mobile Body

The technology according to the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a vessel, and a robot.

Figure 13:
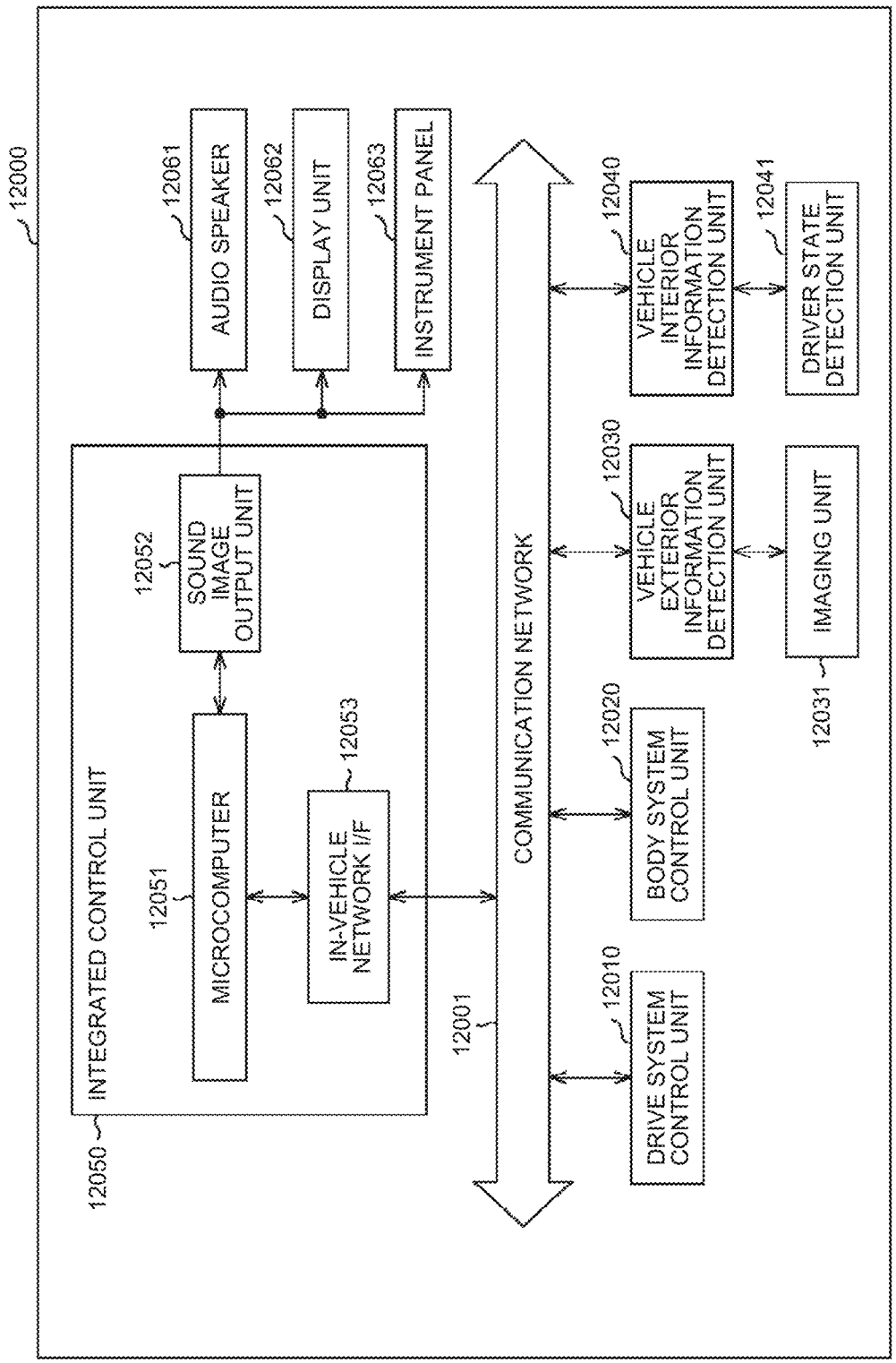
FIG. 13 is a block diagram illustrating an example of a schematic configuration of a vehicle control system.

FIG. 13 is a block diagram illustrating a schematic configuration example of a vehicle control system which is an example of a mobile body control system to which the technology according to the present disclosure can be applied.

A vehicle control system 12000 includes a plurality of electronic control units connected via a communication network 12001. In the example illustrated in FIG. 13, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a sound image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operations of various devices mounted on the vehicle body according to various programs. For example, the body system control unit 12020 functions as a control device of a keyless entry system, a smart key system, a power window device, or various lamps such as a head lamp, a back lamp, a brake lamp, a blinker, and a fog lamp. In this case, radio waves transmitted from a portable device that substitutes for a key or signals of various switches can be input to the body system control unit 12020. The body system control unit 12020 receives input of these radio waves or signals, and controls a door lock device, a power window device, a lamp, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle and receives the captured image. The vehicle exterior information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electric signal corresponding to the amount of received light. The imaging unit 12031 can output the electric signal as an image or can output the electric signal as distance measurement information. The light received by the imaging unit 12031 may be visible light or invisible light such as infrared rays.

The vehicle interior information detection unit 12040 detects information inside the vehicle. For example, a driver state detection unit 12041 that detects a state of a driver is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether or not the driver is dozing off on the basis of the detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040 and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

The microcomputer 12051 controls the driving force generation device, the steering mechanism, the braking device, or the like on the basis of the information around the vehicle acquired by the vehicle exterior information detection unit 12030 or the vehicle interior information detection unit 12040, thereby performing cooperative control for the purpose of automatic driving or the like in which the vehicle autonomously travels without depending on the operation of the driver.

In addition, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the head lamp according to the position of a preceding vehicle or an oncoming vehicle detected by the vehicle exterior information detection unit 12030.

The sound image output unit 12052 transmits an output signal of at least one of a sound or an image to an output device capable of visually or audibly notifying an occupant of the vehicle or the outside of the vehicle of information. In the example of FIG. 13, an audio speaker 12061, a display unit 12062, and an instrument panel 12063 are illustrated as the output device. The display unit 12062 may include, for example, at least one of an on-board display and a head-up display.

Figure 14:
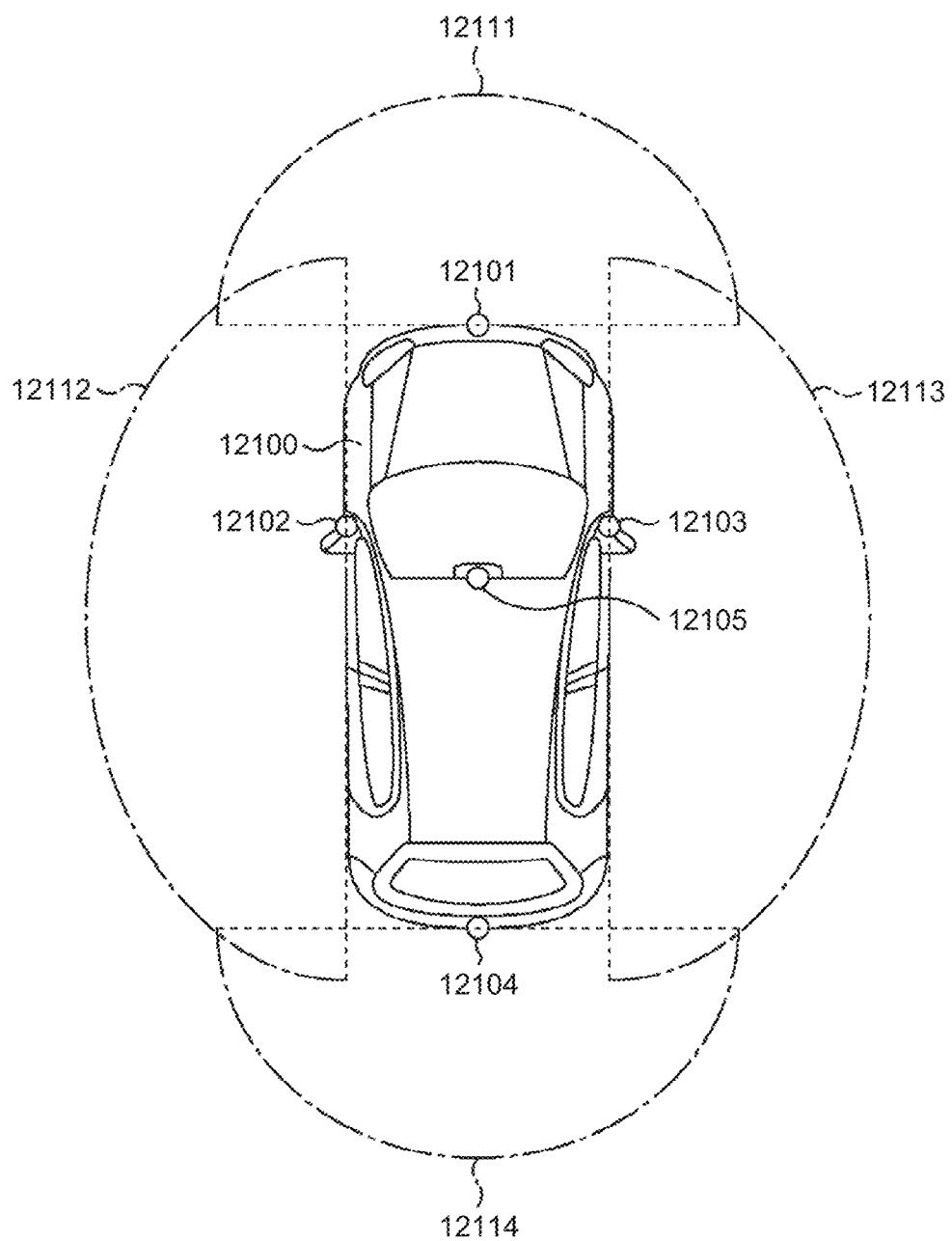
FIG. 14 is an explanatory diagram illustrating an example of installation positions of a vehicle exterior information detection unit and an imaging unit.

FIG. 14 is a diagram illustrating an example of an installation position of the imaging unit 12031.

In FIG. 14, a vehicle 12100 includes imaging units 12101, 12102, 12103, 12104, and 12105 as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of the vehicle 12100. The imaging unit 12101 provided at the front nose and the imaging unit 12105 provided at the upper portion of the windshield in the vehicle interior mainly acquire images in front of the vehicle 12100. The imaging units 12102 and 12103 provided at the side mirrors mainly acquire images of the sides of the vehicle 12100. The imaging unit 12104 provided on the rear bumper or the back door mainly acquires an image behind the vehicle 12100. The front images acquired by the imaging units 12101 and 12105 are mainly used for detecting a preceding vehicle, a pedestrian, an obstacle, a traffic light, a traffic sign, a lane, or the like.

FIG. 14 illustrates an example of photographing ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 obtains a distance to each three-dimensional object in the imaging ranges 12111 to 12114 and a temporal change of the distance (relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Further, the microcomputer 12051 can set an inter-vehicle distance to be secured in advance behind the preceding vehicle and can perform automatic brake control (including follow-up stop control), automatic acceleration control (including follow-up start control), and the like. In this manner, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle, and when the collision risk is a set value or more and there is a possibility of collision, the microcomputer can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in the captured images of the imaging units 12101 to 12104. Such pedestrian recognition is performed by, for example, a procedure of extracting feature points in the captured images of the imaging units 12101 to 12104 as infrared cameras, and a procedure of performing pattern matching processing on a series of feature points indicating an outline of an object to determine whether or not the object is a pedestrian. When the microcomputer 12051 determines that a pedestrian is present in the captured images of the imaging units 12101 to 12104 and recognizes the pedestrian, the sound image output unit 12052 controls the display unit 12062 to superpose and display a square contour line for emphasis on the recognized pedestrian. The sound image output unit 12052 may control the display unit 12062 to display an icon or the like indicating a pedestrian at a desired position.

An example of the vehicle control system to which the technology according to the present disclosure can be applied has been described above. The technology according to the present disclosure can be applied to the imaging unit 12031 among the configurations described above. Specifically, the pixel 120 having the configuration illustrated in FIGS. 3 and 5 to 10 can be applied to the imaging unit 12031. By applying the technology according to the present disclosure to the imaging unit 12031, it is possible to obtain a more easily viewable captured image by appropriately adjusting the balance between the occurrence suppression of blooming and the saturation charge amount, and thus, it is possible to reduce driver's fatigue.

8. Application Example to Endoscopic Surgical System

The technology according to the present disclosure may be applied to an endoscopic surgical system.

Figure 15:
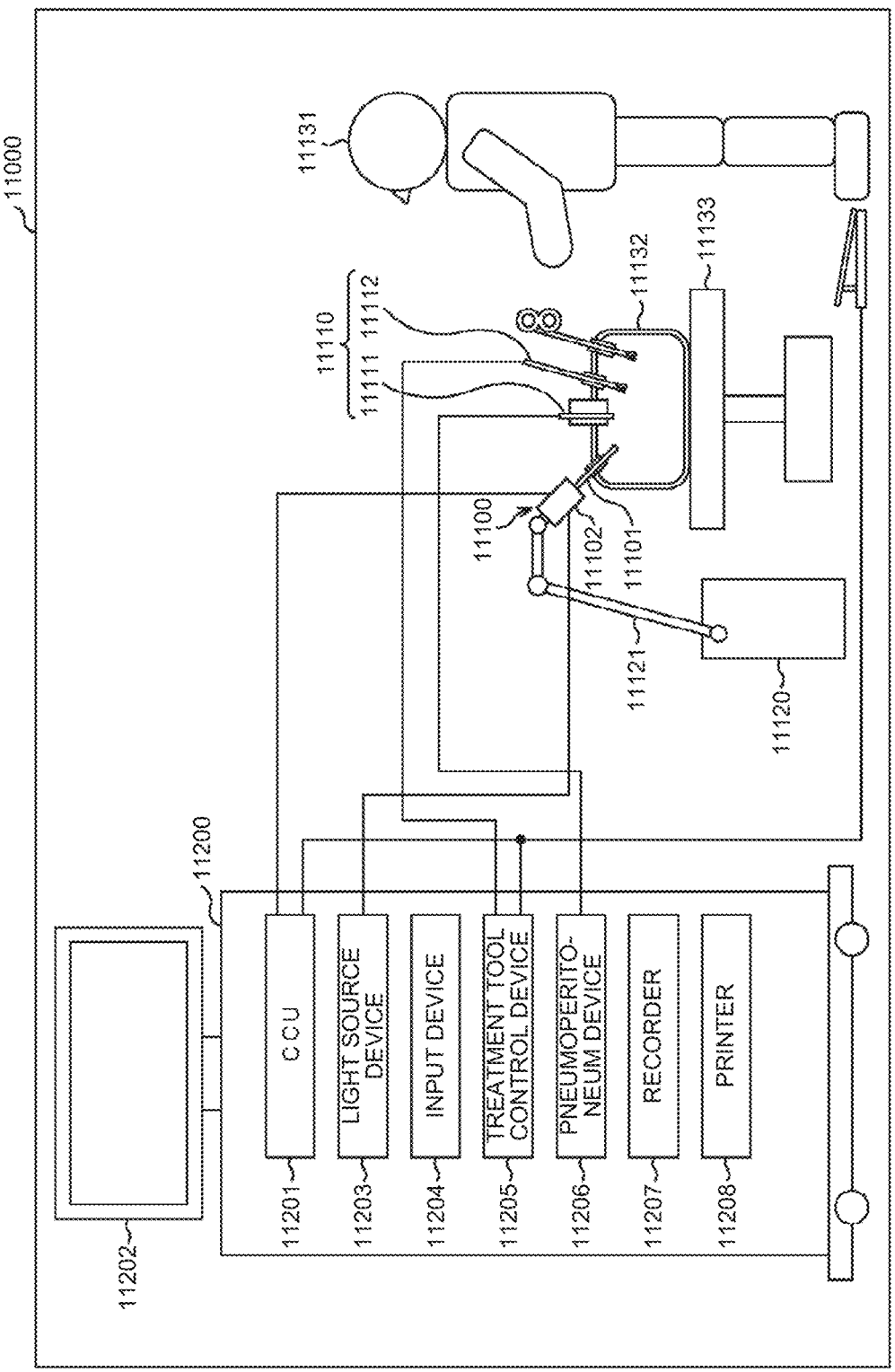
FIG. 15 is a diagram illustrating an example of a schematic configuration of an endoscopic surgical system.

FIG. 15 is a diagram illustrating an example of a schematic configuration of an endoscopic surgical system to which the technology according to the present disclosure (present technology) can be applied.

FIG. 15 illustrates a state in which an operator (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 whose region of a predetermined length from the distal end is inserted into the body cavity of the patient 11132, and a camera head 11102 connected to the proximal end of the lens barrel 11101. In the illustrated example, the endoscope 11100 configured as a so-called rigid scope having the rigid lens barrel 11101 is illustrated, but the endoscope 11100 may be configured as a so-called flexible scope having a flexible lens barrel.

An opening portion into which an objective lens is fitted is provided at the distal end of the lens barrel 11101. A light source device 11203 is connected to the endoscope 11100, and light generated by the light source device 11203 is guided to the distal end of the lens barrel by a light guide extending inside the lens barrel 11101 and is emitted toward an observation target in the body cavity of the patient 11132 via the objective lens. The endoscope 11100 may be a forward-viewing endoscope, an oblique-viewing endoscope, or a side-viewing endoscope.

An optical system and an imaging element are provided inside the camera head 11102, and reflected light (observation light) from the observation target is condensed on the imaging element by the optical system. The observation light is photoelectrically converted by the imaging element, and an electric signal corresponding to the observation light, that is, an image signal corresponding to the observation image is generated. The image signal is transmitted to a camera control unit (CCU) 11201 as RAW data.

The CCU 11201 includes a central processing unit (CPU), a graphics processing unit (GPU), and the like, and integrally controls operation of the endoscope 11100 and a display device 11202. Further, the CCU 11201 receives an image signal from the camera head 11102 and performs various types of image processing for displaying an image based on the image signal, such as development processing (demosaic processing), on the image signal.

The display device 11202 displays an image based on the image signal subjected to the image processing by the CCU 11201 under the control of the CCU 11201.

The light source device 11203 includes a light source such as a light emitting diode (LED), for example, and supplies irradiation light for photographing a surgical site or the like to the endoscope 11100.

An input device 11204 is an input interface for the endoscopic surgical system 11000. A user can input various types of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterization and incision of tissue, sealing of a blood vessel, or the like. A pneumoperitoneum device 11206 feeds gas into the body cavity of the patient 11132 via the pneumoperitoneum tube 11111 in order to inflate the body cavity for the purpose of securing a visual field by the endoscope 11100 and securing a working space of the operator. A recorder 11207 is a device capable of recording various types of information regarding surgery. A printer 11208 is a device capable of printing various types of information regarding surgery in various formats such as text, image, or graph.

The light source device 11203 that supplies the endoscope 11100 with the irradiation light at the time of photographing the surgical site can include a white light source configured by, for example, an LED, a laser light source, or a combination thereof. In a case where the white light source includes a combination of RGB laser light sources, since the output intensity and the output timing of each color (each wavelength) can be controlled with high accuracy, adjustment of the white balance of the captured image can be performed in the light source device 11203. In this case, by irradiating the observation target with the laser light from each of the RGB laser light sources in a time division manner and controlling the driving of the imaging element of the camera head 11102 in synchronization with the irradiation timing, it is also possible to capture an image corresponding to each of RGB in a time division manner. According to this method, a color image can be obtained without providing a color filter in the imaging element.

The driving of the light source device 11203 may be controlled so as to change the intensity of light to be output every predetermined time. By controlling the driving of the imaging element of the camera head 11102 in synchronization with the timing of the change of the light intensity to acquire images in a time division manner and synthesizing the images, it is possible to generate an image of a high dynamic range without so-called blocked up shadows and blown out highlights.

The light source device 11203 may be configured to be able to supply light in a predetermined wavelength band corresponding to special light observation. In the special light observation, for example, so-called narrow band imaging is performed in which a predetermined tissue such as a blood vessel in a mucosal surface layer is imaged with high contrast by irradiating light in a narrower band than irradiation light at the time of normal observation (that is, white light) using wavelength dependency of light absorption in a body tissue. Alternatively, in the special light observation, fluorescence observation for obtaining an image by fluorescence generated by irradiation with excitation light may be performed. In the fluorescence observation, it is possible to irradiate a body tissue with excitation light to observe fluorescence from the body tissue (autofluorescence observation), or to locally inject a reagent such as indocyanine green (ICG) into a body tissue and irradiate the body tissue with excitation light corresponding to a fluorescence wavelength of the reagent to obtain a fluorescent image, for example. The light source device 11203 can be configured to be able to supply narrow band light and/or excitation light corresponding to such special light observation.

FIG. 16 is a block diagram illustrating an example of functional configurations of the camera head 11102 and the CCU 11201 illustrated in FIG. 15.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. Observation light taken in from the distal end of the lens barrel 11101 is guided to the camera head 11102 and enters the lens unit 11401. The lens unit 11401 is configured by combining a plurality of lenses including a zoom lens and a focus lens.

The imaging unit 11402 includes an imaging element. The number of imaging elements constituting the imaging unit 11402 may be one (so-called single-plate type) or plural (so-called multi-plate type). In a case where the imaging unit 11402 is configured as a multi-plate type, for example, image signals corresponding to RGB may be generated by the respective imaging elements, and a color image may be obtained by combining the image signals. Alternatively, the imaging unit 11402 may include a pair of imaging elements for acquiring right-eye and left-eye image signals corresponding to three-dimensional (3D) display. Performing the 3D display enables the operator 11131 to grasp the depth of the living tissue in the surgical site more accurately. In a case where the imaging unit 11402 is configured as a multi-plate type, a plurality of lens units 11401 can be provided corresponding to the respective imaging elements.

The imaging unit 11402 is not necessarily provided in the camera head 11102. For example, the imaging unit 11402 may be provided immediately behind the objective lens inside the lens barrel 11101.

The drive unit 11403 includes an actuator and moves the zoom lens and the focus lens of the lens unit 11401 by a predetermined distance along the optical axis under the control of the camera head control unit 11405. This enables appropriate adjustment of the magnification and focus of the image captured by the imaging unit 11402.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

The communication unit 11404 receives a control signal for controlling driving of the camera head 11102 from the CCU 11201 and supplies the control signal to the camera head control unit 11405. The control signal includes, for example, information regarding imaging conditions such as information for specifying a frame rate of a captured image, information for specifying an exposure value at the time of imaging, and/or information for specifying a magnification and a focus of a captured image.

The imaging conditions such as the frame rate, the exposure value, the magnification, and the focus may be appropriately specified by the user or may be automatically set by the control unit 11413 of the CCU 11201 on the basis of the acquired image signal. In the latter case, a so-called auto exposure (AE) function, an auto focus (AF) function, and an auto white balance (AWB) function are installed in the endoscope 11100.

The camera head control unit 11405 controls driving of the camera head 11102 on the basis of the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

The communication unit 11411 transmits a control signal for controlling driving of the camera head 11102 to the camera head 11102. The image signal and the control signal can be transmitted by electric communication, optical communication, or the like.

The image processing unit 11412 performs various types of image processing on the image signal that is RAW data transmitted from the camera head 11102.

The control unit 11413 performs various types of control related to imaging of a surgical site or the like by the endoscope 11100 and display of a captured image obtained by imaging of the surgical site or the like. For example, the control unit 11413 generates a control signal for controlling driving of the camera head 11102.

The control unit 11413 causes the display device 11202 to display a captured image of a surgical site or the like on the basis of the image signal subjected to the image processing by the image processing unit 11412. At this time, the control unit 11413 may recognize various objects in the captured image using various image recognition technologies. For example, the control unit 11413 can recognize a surgical tool such as forceps, a specific body part, bleeding, mist at the time of using the energy treatment tool 11112, and the like by detecting the shape, color, and the like of the edge of the object included in the captured image. When displaying the captured image on the display device 11202, the control unit 11413 may superpose and display various types of surgery support information on the image of the surgical site by using the recognition result. With the superposed display of the surgery support information presented to the operator 11131, the burden on the operator 11131 can be reduced and the operator 11131 can reliably proceed with the surgery.

The transmission cable 11400 connecting the camera head 11102 and the CCU 11201 is an electric signal cable compatible with electric signal communication, an optical fiber compatible with optical communication, or a composite cable thereof.

Here, in the illustrated example, communication is performed by wire using the transmission cable 11400, but communication between the camera head 11102 and the CCU 11201 may be performed wirelessly.

An example of the endoscopic surgical system to which the technology according to the present disclosure can be applied has been described above. The technology according to the present disclosure can be applied to the endoscope 11100 and the imaging unit 11402 of the camera head 11102 among the above-described configurations. Specifically, the pixel 120 having the configuration illustrated in FIGS. 3 and 5 to 10 can be applied to the endoscope 11100 and the imaging unit 11402 of the camera head 11102. By applying the technology according to the present disclosure to the endoscope 11100 and the imaging unit 11402 of the camera head 11102, it is possible to obtain a clearer image of the surgical site by appropriately adjusting the balance between the occurrence suppression of blooming and the saturation charge amount, and thus, it is possible for the operator to reliably check the surgical site.

Note that, here, the endoscopic surgical system has been described as an example, but the technology according to the present disclosure may be applied to, for example, a microscopic surgical system or the like.

Although the above description is given regarding the embodiments of the present disclosure, the technical scope of the present disclosure is not limited to the above-described embodiments as they are, and various modifications can be made without departing from the scope of the present disclosure. In addition, the components in different embodiments and modifications may be appropriately combined.

The effects described in the present specification are merely examples and are not restrictive of the disclosure herein, and other effects may be achieved.

Note that the present technology can also have the following configurations.

(1)

A solid-state imaging device comprising:
a photoelectric conversion unit that generates a photoelectric charge;
a first charge holding unit that is connected to the photoelectric conversion unit and holds the photoelectric charge generated by the photoelectric conversion unit;
a first transistor for discharging the photoelectric charge held by the first charge holding unit to an outside; and
a voltage control unit that controls a voltage value of an off voltage to be applied to a gate of the first transistor when the first transistor is turned off.

(2)

The solid-state imaging device according to (1), further comprising:
a second charge holding unit that holds the photoelectric charge transferred from the first charge holding unit;
a second transistor disposed on a wiring connecting the first charge holding unit and the second charge holding unit;
a third transistor disposed on a wiring connecting the second charge holding unit and a constant voltage source;
a fourth transistor that outputs, to a signal line, a pixel signal having a voltage value corresponding to a charge amount of the photoelectric charge held in the second charge holding unit; and
a fifth transistor disposed on a wiring connecting the fourth transistor and the signal line.

(3)

The solid-state imaging device according to (1) or (2), wherein
the photoelectric conversion unit contains any one of indium gallium arsenide (InGaAs), indium arsenide antimony (InAsSb), indium arsenide (InAs), indium antimony (InSb), mercury cadmium telluride (HgCdTe), germanium (Ge), a quantum dot, and an organic compound, and the first transistor is a P-type metal oxide semiconductor (MOS) transistor.

(4)

The solid-state imaging device according to (1) or (2), wherein the photoelectric conversion unit is a photodiode, and the first transistor is an N-type MOS transistor.

(5)

The solid-state imaging device according to any one of (1) to (4), wherein an electrode extending from the photoelectric conversion unit and an electrode extending from the first charge holding unit are directly joined and conducted.

(6)

The solid-state imaging device according to any one of (1) to (4), wherein a terminal extending from the photoelectric conversion unit and a terminal extending from the first charge holding unit are connected by a bump electrode and conducted.

(7)

The solid-state imaging device according to any one of (1) to (6), further comprising a feedback control unit that controls a voltage value of a voltage output from a power source and applies the voltage to the gate of the first transistor, wherein the voltage control unit changes the voltage value of the off voltage by outputting information on a gate voltage to the feedback control unit.

(8)

The solid-state imaging device according to any one of (1) to (6), wherein the voltage control unit receives an input of a supply voltage with the voltage value that has been switched by an external power source, and changes the voltage value of the off voltage using the supply voltage.

(9)

The solid-state imaging device according to any one of (1) to (8), further comprising:

a pixel array unit in which a plurality of pixels are arranged in a row and column directions;

a drive circuit that drives a pixel to be read out in the plurality of pixels;

a processing circuit that reads out a pixel signal from the pixel to be read out driven by the drive circuit; and a control unit that controls the drive circuit and the processing circuit.

(10)

The solid-state imaging device according to (9), wherein the voltage control unit changes the voltage value of the off voltage for each of the one or plurality of rows in the pixel array unit.

(11)

The solid-state imaging device according to (9), wherein the pixel array unit is divided into a plurality of regions, and the voltage control unit changes the voltage value of the off voltage for each of the plurality of regions.

(12)

The solid-state imaging device according to any one of (1) to (11), further comprising a plurality of buffers provided for each of the one or plurality rows, each of the plurality of buffers holding a voltage to be applied to the gate of the first transistor, wherein the voltage control unit controls timing of supplying the voltage held by each of the plurality of buffers to the one or plurality of rows.

(13)

An electronic device comprising:

a solid-state imaging device;

an optical system that forms an image of incident light on a light receiving surface of the solid-state imaging device; and a processor that controls the solid-state imaging device, wherein the solid-state imaging device includes:

a photoelectric conversion unit that generates a photoelectric charge;

a first charge holding unit that is connected to the photoelectric conversion unit and holds the photoelectric charge generated by the photoelectric conversion unit;

a first transistor for discharging the photoelectric charge held by the first charge holding unit to an outside; and a voltage control unit that controls a voltage value of an off voltage to be applied to a gate of the first transistor when the first transistor is turned off.

REFERENCE SIGNS LIST

1 PIXEL CIRCUIT
2 VOLTAGE CONTROL CIRCUIT
10 PHOTOELECTRIC CONVERSION FILM
11 RESET TRANSISTOR
12 AMPLIFICATION TRANSISTOR
13 SELECTION TRANSISTOR
14 TRANSFER TRANSISTOR
15 DISCHARGE TRANSISTOR
16, 17 CAPACITOR
20 FLOATING DIFFUSION (FD)
21 SENSE NODE (SN)
100 ELECTRONIC DEVICE
101 IMAGING LENS
102 IMAGE SENSOR
103 PROCESSOR
104 STORAGE UNIT
111 BIAS VOLTAGE SOURCE
112 POWER SOURCE
113 FEEDBACK CONTROL UNIT
114 VOLTAGE CONTROL UNIT
115 BUFFER
116 EXTERNAL POWER SOURCE
120 PIXEL
121 PIXEL ARRAY
122 VERTICAL DRIVE CIRCUIT
123 COLUMN PROCESSING CIRCUIT
124 HORIZONTAL DRIVE CIRCUIT
125 SYSTEM CONTROL UNIT
126 SIGNAL PROCESSING UNIT
127 DATA STORAGE UNIT
150 ROW CONTROL CIRCUIT

The invention claimed is:
1. A solid-state imaging device comprising:
a photoelectric conversion unit that generates a photoelectric charge;

a first charge holding unit that is connected to the photoelectric conversion unit and holds the photoelectric charge generated by the photoelectric conversion unit;
a first transistor for discharging the photoelectric charge held by the first charge holding unit;
a voltage control circuit that controls a voltage value of an off voltage to be applied to a gate of the first transistor when the first transistor is turned off;
a second charge holding unit that holds the photoelectric charge transferred from the first charge holding unit;
a second transistor disposed on a wiring connecting the first charge holding unit and the second charge holding unit;
a third transistor disposed on a wiring connecting the second charge holding unit and a constant voltage source;
a fourth transistor that outputs, to a signal line, a pixel signal having a voltage value corresponding to a charge amount of the photoelectric charge held in the second charge holding unit; and
a fifth transistor disposed on a wiring connecting the fourth transistor and the signal line.

2. The solid-state imaging device according to claim 1, wherein
the photoelectric conversion unit contains any one of indium gallium arsenide (InGaAs), indium arsenide antimony (InAsSb), indium arsenide (InAs), indium antimony (InSb), mercury cadmium telluride (HgCdTe), germanium (Ge), a quantum dot, and an organic compound, and
the first transistor is a P-type metal oxide semiconductor (MOS) transistor.

3. The solid-state imaging device according to claim 1, wherein
the photoelectric conversion unit is a photodiode, and the first transistor is an N-type MOS transistor.

4. The solid-state imaging device according to claim 1, wherein
an electrode extending from the photoelectric conversion unit and an electrode extending from the first charge holding unit are directly joined.

5. The solid-state imaging device according to claim 1, wherein
a terminal extending from the photoelectric conversion unit and a terminal extending from the first charge holding unit are connected by a bump electrode.

6. The solid-state imaging device according to claim 1, wherein
the voltage control circuit receives an input of a supply voltage with the voltage value that has been switched by an external power source, and changes the voltage value of the off voltage using the supply voltage.

7. An electronic device comprising the solid-state imaging device according to claim 1.

8. A solid-state imaging device comprising:
a photoelectric conversion unit that generates a photoelectric charge;
a first charge holding unit that is connected to the photoelectric conversion unit and holds the photoelectric charge generated by the photoelectric conversion unit;
a first transistor for discharging the photoelectric charge held by the first charge holding unit;
a voltage control unit that controls a voltage value of an off voltage to be applied to a gate of the first transistor when the first transistor is turned off; and
a feedback control circuit that controls a voltage value of a voltage output from a power source and applies the voltage to the gate of the first transistor, wherein
the voltage control circuit changes the voltage value of the off voltage by outputting information on a gate voltage to the feedback control circuit.

9. An electronic device comprising the solid-state imaging device according to claim 8.

10. A solid-state imaging device comprising:
a pixel array including a plurality of pixels;
a drive circuit that drives the plurality of pixels;
a processing circuit that reads pixel signals from the plurality of pixels for a read out; and
a controller that controls the drive circuit and the processing circuit,
wherein each of the plurality of pixels includes
a photoelectric conversion unit that generates a photoelectric charge,
a first charge holding unit that is connected to the photoelectric conversion unit and holds the photoelectric charge generated by the photoelectric conversion unit,
a first transistor for discharging the photoelectric charge held by the first charge holding unit, and
a voltage control unit that controls a voltage value of an off voltage to be applied to a gate of the first transistor when the first transistor is turned off; wherein
the voltage control circuit changes the voltage value of the off voltage for each of one or more rows of the plurality of pixels in the pixel array.

11. The solid-state imaging device according to claim 10, further comprising:
a plurality of buffers provided for each of the one or more rows, each of the plurality of buffers holding a voltage to be applied to the gate of the first transistor, wherein
the voltage control circuit controls timing of supplying the voltage held by each of the plurality of buffers to the one or more or rows.

12. A solid-state imaging device comprising:
a pixel array including a plurality of pixels;
a drive circuit that drives the plurality of pixels;
a processing circuit that reads pixel signals from the plurality of pixels for a read out; and
a controller that controls the drive circuit and the processing circuit,
wherein each of the plurality of pixels includes
a photoelectric conversion unit that generates a photoelectric charge,
a first charge holding unit that is connected to the photoelectric conversion unit and holds the photoelectric charge generated by the photoelectric conversion unit,
a first transistor for discharging the photoelectric charge held by the first charge holding unit, and
a voltage control unit that controls a voltage value of an off voltage to be applied to a gate of the first transistor when the first transistor is turned off; wherein
the pixel array is divided into a plurality of regions, and
the voltage circuit changes the voltage value of the off voltage for each of the plurality of regions.

13. An electronic device comprising the solid-state imaging device according to claim 10.

14. An electronic device comprising the solid-state imaging device according to claim 12.

* * * * *